(12) United States Patent
Choi et al.

(10) Patent No.: US 11,614,208 B2
(45) Date of Patent: Mar. 28, 2023

(54) LIGHTING MODULE AND LIGHTING DEVICE COMPRISING SAME

(71) Applicant: LG INNOTEK CO., LTD., Seoul (KR)

(72) Inventors: Young Jae Choi, Seoul (KR); Dong Hyun Lee, Seoul (KR); Ki Chang Lee, Seoul (KR); Gyeong Il Jin, Seoul (KR); Moo Ryong Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 17/872,110

(22) Filed: Jul. 25, 2022

(65) Prior Publication Data

US 2022/0356996 A1 Nov. 10, 2022

Related U.S. Application Data

(63) Continuation of application No. 17/439,466, filed as application No. PCT/KR2020/003808 on Mar. 19, 2020, now Pat. No. 11,428,372.

(30) Foreign Application Priority Data

Mar. 22, 2019 (KR) ........................ 10-2019-0033194

(51) Int. Cl.
*F21K 9/68* (2016.01)
*F21V 7/04* (2006.01)
(Continued)

(52) U.S. Cl.
CPC .................. *F21K 9/68* (2016.08); *F21V 7/04* (2013.01); *F21Y 2113/13* (2016.08); *F21Y 2115/10* (2016.08)

(58) Field of Classification Search
None
See application file for complete search history.

(56) References Cited

U.S. PATENT DOCUMENTS

| 7,213,936 B2 | 5/2007 | Wang et al. |
| 7,455,441 B2 | 11/2008 | Chosa et al. |

(Continued)

FOREIGN PATENT DOCUMENTS

| CN | 101876407 | 11/2010 |
| CN | 103486511 | 1/2014 |

(Continued)

OTHER PUBLICATIONS

International Search Report dated Jul. 6, 2020 issued in Application No. PCT/KR2020/003808.

(Continued)

*Primary Examiner* — Elmito Breval
(74) *Attorney, Agent, or Firm* — KED & Associates, LLP

(57) ABSTRACT

A lighting device disclosed in an embodiment of the invention includes a substrate; light sources disposed on the substrate; and a resin layer disposed on the substrate and the light sources. a first reflective layer disposed on the resin layer, wherein the resin layer includes an exit surface facing the light sources, and the exit surface of the resin layer includes convex portions facing each of the light sources and recess portions respectively disposed between the plurality of convex portions, concave surfaces disposed in each of the plurality of recess portions may have a curvature, and a radius of curvature of the concave surfaces may increase in one direction.

20 Claims, 12 Drawing Sheets

(51) Int. Cl.
*F21Y 113/13* (2016.01)
*F21Y 115/10* (2016.01)

(56) References Cited

U.S. PATENT DOCUMENTS

| | | |
|---|---|---|
| 8,247,831 B2 | 8/2012 | Jagt |
| 9,890,916 B2 | 2/2018 | Oh |
| 9,978,917 B1 | 5/2018 | Ye et al. |
| 10,293,369 B2 | 5/2019 | Aizawa et al. |
| 10,648,626 B2 | 5/2020 | Hwang |
| 10,753,546 B2 | 8/2020 | Hwang et al. |
| 11,125,396 B2 | 9/2021 | Hwang et al. |
| 2007/0109792 A1 | 5/2007 | Orsley et al. |
| 2011/0018020 A1 | 1/2011 | Jagt |
| 2013/0329445 A1 | 12/2013 | Oh |
| 2018/0178247 A1 | 6/2018 | Aizawa et al. |
| 2019/0137046 A1* | 5/2019 | Hwang ............... G02B 5/02 |
| 2020/0332966 A1 | 10/2020 | Hwang et al. |

FOREIGN PATENT DOCUMENTS

| | | |
|---|---|---|
| DE | 10-2011-002340 | 10/2012 |
| EP | 1670069 | 6/2006 |
| EP | 3453939 | 3/2019 |
| JP | 2007-158009 | 6/2007 |
| JP | 2009-043708 | 2/2009 |
| JP | 5666306 | 2/2015 |
| JP | 2018-107333 | 7/2018 |
| JP | 2018-137127 | 8/2018 |
| KR | 10-2015-0017594 | 2/2015 |
| KR | 10-2017-0132058 | 12/2017 |
| WO | WO 2009/066207 | 5/2009 |
| WO | WO 2016/171279 | 10/2016 |

OTHER PUBLICATIONS

European Search Report dated Oct. 28, 2022 issued in Application No. 20776678.3.
Chinese Office Action dated Dec. 14, 2022 issued in Application No. 202080023257.2.

* cited by examiner

LIGHTING MODULE AND LIGHTING DEVICE COMPRISING SAME

CROSS-REFERENCE TO RELATED PATENT APPLICATIONS

This application is a Continuation of U.S. patent application Ser. No. 17/439,466, filed Sep. 15, 2021, which is a U.S. National Stage Application under 35 U.S.C. § 371 of PCT Application No. PCT/KR2020/003808, filed Mar. 19, 2020, which claims priority to Korean Patent Application No. 10-2019-0033194, filed Mar. 22, 2019, whose entire disclosures are hereby incorporated by reference.

TECHNICAL FIELD

An embodiment of the invention relates to a lighting module having a plurality of light sources and a lighting device having the same. An embodiment of the invention relates to a lighting module that provides a surface light source in a form of a line. An embodiment of the invention relates to a lighting device having a lighting module, a light unit, a liquid crystal display device, or a vehicle lamp.

BACKGROUND ART

Lighting applications include vehicle lights as well as backlights for displays and signs. Light emitting device, such as light emitting diode (LED), have advantages such as low power consumption, semi-permanent life, fast response speed, safety, and environmental friendliness compared to conventional light sources such as fluorescent lamps and incandescent lamps. These light emitting diodes are applied to various display devices, various lighting devices such as indoor or outdoor lights. Recently, as a vehicle light source, a lamp employing a light emitting diode has been proposed. Compared with incandescent lamps, light emitting diodes are advantageous in that power consumption is small. However, since an exit angle of light emitted from the light emitting diode is small, when the light emitting diode is used as a vehicle lamp, there is a demand for increasing the light emitting area of the lamp using the light emitting diode. Since the light emitting diode is small, it may increase the design freedom of the lamp, and it is economical due to its semi-permanent life.

DISCLOSURE

Technical Problem

An embodiment of the invention provides a lighting module for irradiating a surface light in the form of a line in one direction and a lighting device having the same. An embodiment of the invention provides a lighting module for irradiating light emitted from a plurality of light sources as a line-shaped light source or a surface light source, and a device having the same. An embodiment of the invention provides a lighting device for irradiating light in one direction of the resin layer by disposing a light source and a resin layer between a substrate and a reflective layer. An embodiment of the invention provides a lighting device in which a resin layer having a light source is disposed between a plurality of reflective layers. An embodiment of the invention provides a lighting device in which a light source and a resin layer are disposed between a plurality of reflective layers, and a light extraction structure is provided on one surface of the resin layer. An embodiment of the invention provides a lighting device in which a light source and a resin layer are disposed between a plurality of reflective layers, and a convex portion and a recess portion are disposed on one surface of the reflective layers and the resin layer. An embodiment of the invention may provide a light unit having a lighting module, a liquid crystal display, and a vehicle lamp.

Technical Solution

A lighting device according to an embodiment of the invention includes: a substrate; a plurality of light sources disposed on the substrate; a resin layer disposed on the substrate and the plurality of light sources; and a first reflective layer disposed on the resin layer, wherein the resin layer includes an exit surface facing the light sources, and the exit surface of the resin layer may include a plurality of convex portions facing each of the light sources and a plurality of recess portions respectively disposed between the plurality of convex portions, wherein a concave surface disposed in each of the plurality of recess portions may have a curvature, and the concave surfaces may have a greater radius of curvature as they progress in one direction.

According to an embodiment of the invention, the exit surface of the resin layer is a first surface, the resin layer includes a second surface opposite to the first surface, third and fourth surfaces extending to both ends of the first and second surfaces, and wherein a length of the third surface may be greater than a length of the fourth surface. A thickness of the exit surface of the resin layer may be the same as a thickness of the second to fourth surfaces. The radius of curvature of the concave surfaces become larger as it is adjacent to the fourth surface, and a diameter of a virtual circle formed by each of the convex portions may be the same as the radius of curvature of the largest concave surface among the concave surfaces or may have a difference of 10% or less from each other. A contact area between a first convex portion adjacent to the third surface among the convex portions and a circumference of a first virtual circle formed by the first convex portion is ⅓ or more of a length of the circumference, and wherein a contact area between a second convex portion adjacent to the fourth surface among the convex portions and a circumference of a second virtual circle formed by the second convex portion is ⅓ or more of a length of the circumference. An interior angle between a straight line connecting the first convex portion and the convex portions adjacent to the first convex portion and a straight line connecting the second convex portion and the convex portions adjacent to the second convex portion may be an obtuse angle.

According to an embodiment of the invention, the imaginary line connecting the plurality of light sources may be convex with respect to a straight line connecting the first convex portion adjacent to the third surface and the second convex portion adjacent to the fourth surface among the convex portions. An angle between the first straight line connecting the centers of adjacent light sources and the second straight line passing through the centers of the respective light sources and the center of the virtual circles formed by each convex portion may be an obtuse angle. The angle between the first straight line and the second straight line connecting the adjacent light sources may be increased as it is adjacent to the fourth surface. The embodiment of the invention includes a second reflective layer disposed between the resin layer and the substrate, and the substrate and the first and second reflective layers may be disposed on convex portions of the resin layer.

Advantageous Effects

According to an embodiment of the invention, it is possible to improve the luminous intensity of the light emitted in a line shape having a thin thickness and a long length in one direction by a lighting module or a lighting device. According to an embodiment of the invention, a surface light source with a form of the line may provide by a resin layer and a light source disposed between a plurality of reflective layers. Since a resin layer covering the light source is disposed between the plurality of reflective layers, the process of the lighting module may be simplified, and light loss may be reduced to improve light efficiency. In addition, since the lighting module having a thin thickness is provided in the form of a line light source, design freedom may be increased.

According to an embodiment of the invention, it is possible to improve the light uniformity of the surface light source emitted between the plurality of reflective layers. Since the center of each of the plurality of light sources and the center of the virtual circle forming along the convex portion of the resin layer are aligned with each other, the light uniformity may be improved along the light exit direction. According to an embodiment of the invention, since the light source and the convex portions of the resin layer disposed along a virtual curve or oblique direction is disposed to face each other, the uniformity of light may be improved. It is possible to improve the optical reliability of the lighting module and the lighting device having the same according to an embodiment of the invention. The invention may be applied to a vehicle lighting device having a lighting module, a light unit, various types of display devices, a surface light source lighting device, or a vehicle lamp.

BEST MODE

Figure 1:
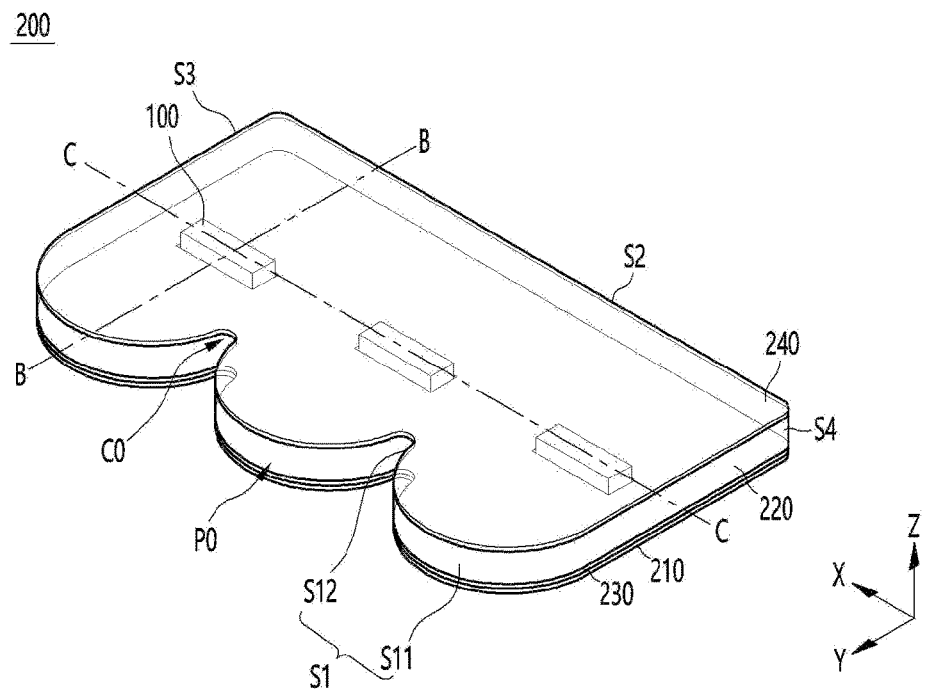
FIG. 1 is a perspective view showing a lighting device according to a first embodiment of the invention.

Hereinafter, with reference to the accompanying drawings will be described in detail preferred embodiments that may be easily carried out by the person of ordinary skill in the art. However, it should be understood that the configurations shown in the embodiments and drawings described in this specification are only preferred embodiments of the invention, and that there may be various equivalents and modifications that can replace them at the time of application. In the detailed description of the operating principle for the preferred embodiment of the invention, when it is determined that a detailed description of related known functions or configurations may unnecessarily obscure the subject matter of the invention, the detailed description will be omitted. Terms to be described later are terms defined in consideration of functions in the invention, and the meaning of each term should be interpreted based on the contents throughout the present specification. The same reference numerals are used for parts having similar functions and functions throughout the drawings. The lighting device according to the invention may be applied to various lamp devices that require lighting, such as vehicle lamps, household lighting devices, and industrial lighting devices. For example, when applied to vehicle lamps, head lamps, car lights, side mirror lights, fog lights, tail lamps, brake lights, daytime running lights, vehicle interior lights, door scars, rear combination lamps, backup lamps It is applicable to back. The lighting device of the invention may be applied to indoor and outdoor advertising devices, display devices, and various electric vehicle fields. In addition, it may be applied to all lighting-related fields or advertising-related fields that are currently developed and commercialized or may be implemented according to future technological development.

Hereinafter, the embodiments will be apparent through the description of the accompanying drawings and embodiments. In the description of the embodiments, each layer (film), region, pattern or structure is formed "on" or "under" of the substrate, each layer (film), region, pad or patterns. In the case described as, "on" and "under" include both "directly" or "indirectly" formed through another layer. In addition, the criteria for the top or bottom of each layer will be described based on the drawings.

<Lighting Device>

Figure 2:
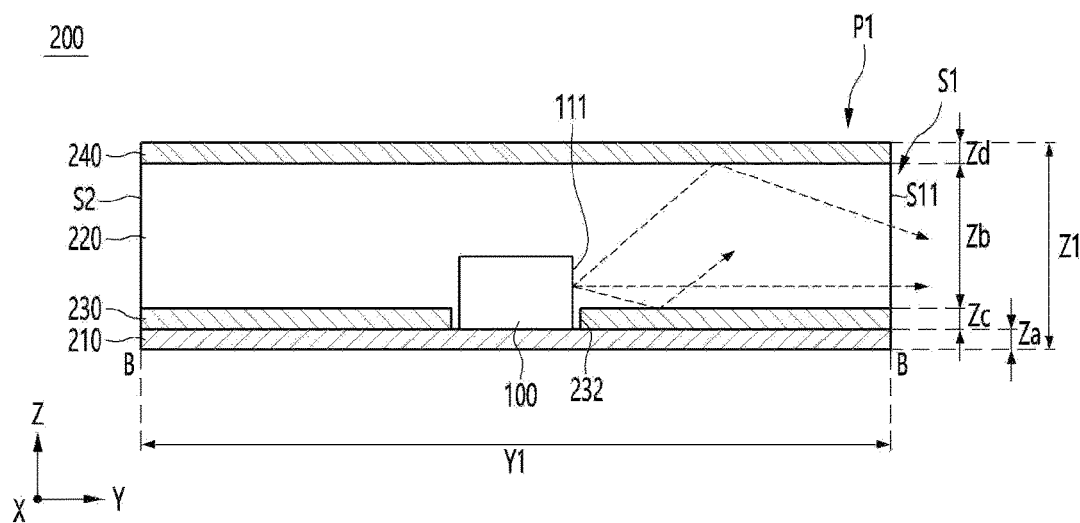
FIG. 2 is a cross-sectional view taken along a B-B side of the lighting device of FIG. 1.
Figure 3:
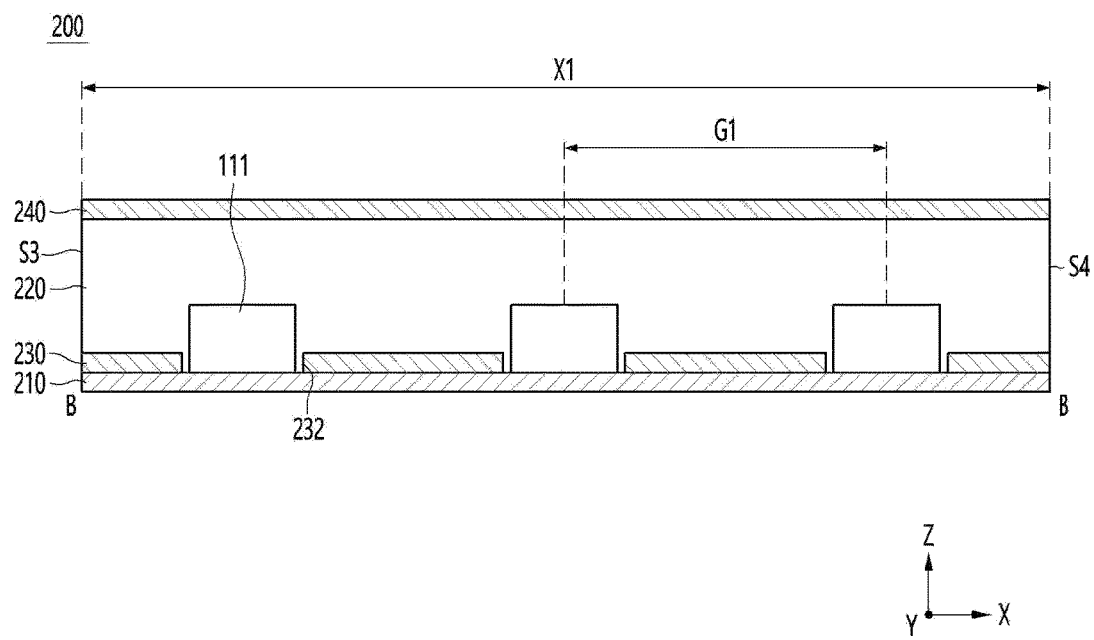
FIG. 3 is a cross-sectional view taken along a C-C side of the lighting device of FIG. 1.
Figure 4:
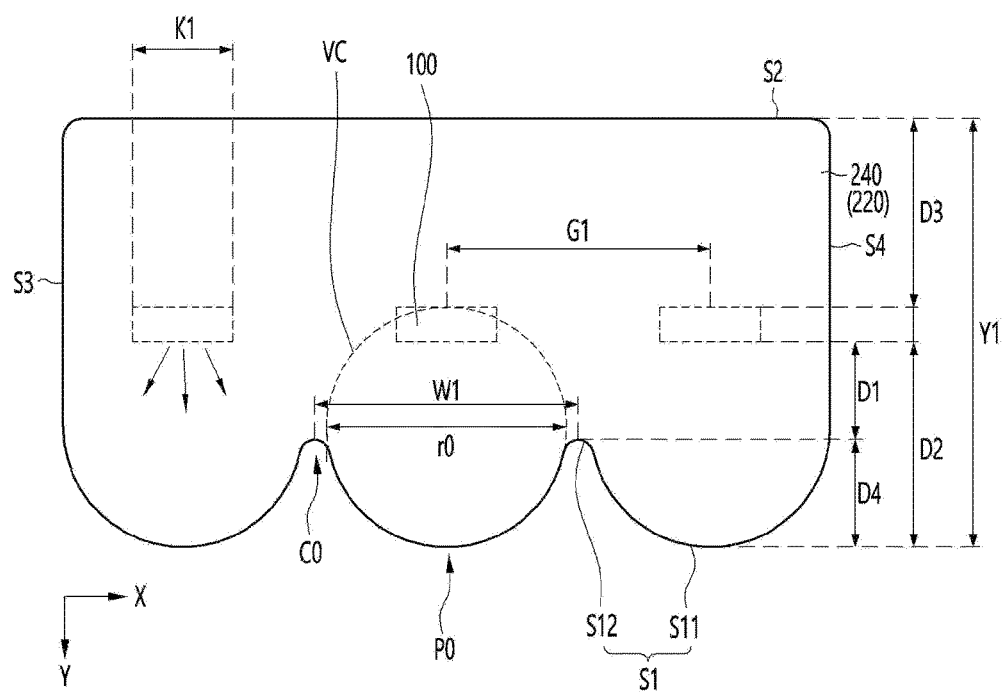
FIG. 4 is an example of a plan view of the lighting device of FIG. 1.

FIG. 1 is a perspective view showing a lighting device according to a first embodiment of the invention, FIG. 2 is a cross-sectional view taken along a B-B side of the lighting device of FIG. 1, FIG. 3 is a cross-sectional view taken along a C-C side of the lighting device of FIG. 1, and FIG. 4 is an example of a plan view of the lighting device of FIG. 1.

Referring to FIGS. 1 to 4, a lighting device 200 according to an embodiment of the invention includes a plurality of light sources 100, and irradiates the light emitted from the plurality of light sources 100 as a light source having a light width. The light emitted from the light source 100 may be emitted as a surface light source having a line width or a thin height. The lighting device 200 may be a flexible module or a rigid module. The lighting device 200 may be flat or curved in at least one of the first and second directions Y and X. The lighting device 200 may include both sides corresponding to each other in the first direction Y and both sides corresponding to each other in the second direction X. The line width in the lighting device 200 is a vertical height, and may be 3 mm or less, for example, in the range of 2.4 mm to 3 mm. The lighting by the lighting device 200 may be provided in a module such as a straight line, a curved line, or a wave shape, so that the degree of freedom in lighting design may be improved, and it may be effectively installed at a lamp position of a bracket or a housing. The lighting device 200 may include a substrate 210, a light source 100 disposed on the substrate 210, a resin layer 220 disposed on the substrate 210 and the light source 100, and a first reflective layer 240 disposed on the resin layer 220. The lighting device 200 may include a second reflective layer 230 between the substrate 210 and the resin layer 220.

Figure 5:
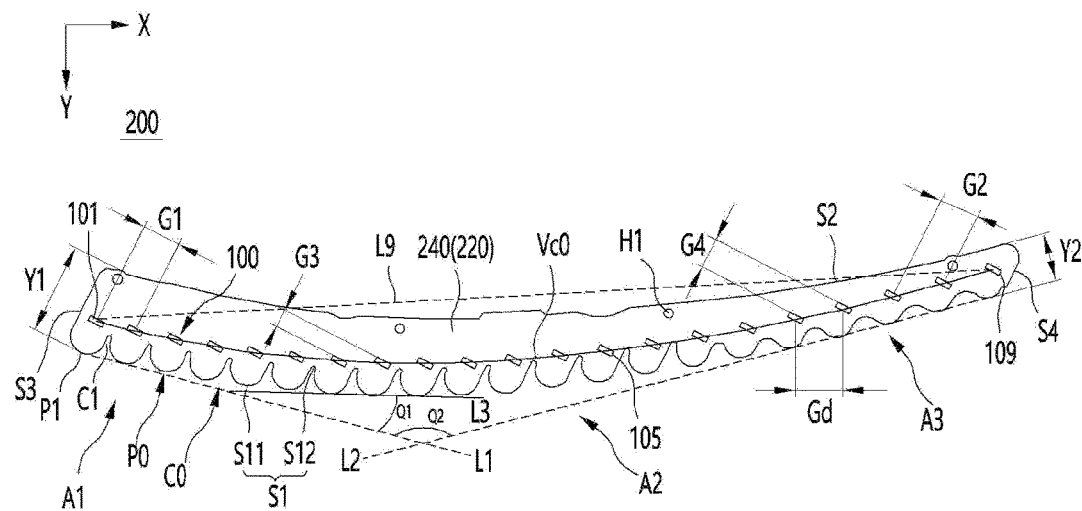
FIG. 5 is an example of a plan view of a lighting device according to a second embodiment of the invention.

A plurality of the light sources 100 may be arranged in a direction of the second direction X or in a direction from the third surface S3 to the fourth surface S4. The light sources 100 may be arranged in one row. As another example, the light source 100 may be arranged in two or more different columns. The plurality of light sources 100 may be arranged on a straight line or a curved line extending in the second direction X. Each of the light sources 100 may be a light emitting device. Here, as shown in FIG. 4, the intervals G1 between adjacent light sources 100 may be the same. The intervals G1 may be equal to each other for uniform distribution of light emitted from the light sources 100. The interval G1 may be greater than the thickness of the lighting device 200, for example, a vertical distance (e.g., Z1) from the lower surface of the substrate 210 to the upper surface of the first reflective layer 240. For example, when the vertical distance is Z1, the interval G1 may be three times or more of the thickness Z1. The interval G1 may be 10 mm or more, for example, in the range of 10 mm to 20 mm. When the interval G1 is larger than the above range, the luminous intensity may be decreased, and when it is smaller than the above range, the number of light sources 100 may be increased. As another example, as shown in FIG. 5, adjacent light sources 100 may not be arranged on the same straight line, and in this case, a line connecting two adjacent light sources 100 may be provided as a virtual curve or a curve having an inflection point. When the intervals G1 are equally spaced, the uniformity of light may be improved.

In the lighting device 200, the maximum length X1 in the second direction X may be greater than the maximum length Y1 in the first direction Y. The lengths in the first and second directions Y and X may be greater than the thickness Z1 or the height in the vertical direction Z. The maximum length X1 in the second direction X may vary depending on the number of arrangements of the light sources 100, and may be, for example, 30 mm or more. The maximum length Y1 in the first direction Y may be 13 mm or more, for example, in the range of 13 mm to 25 mm. The maximum length Y1 in the first direction Y of the lighting device 200 may be provided taking into account a region in which the light emitted from the light source 100 is diffused, a region protecting the rear of the light source 100, and a pattern region. With respect to the maximum length Y1 in the first direction Y, the length on the third surface (e.g., S3) and the length on the fourth surface (e.g., S4) of the lighting device may be the same or different from each other.

The light source 100 may be disposed between layers of a reflective material facing each other in a vertical direction. The light source 100 may be disposed closer to any one layer in a region between the layers of the reflective material facing each other in the vertical direction. The light source 100 may be disposed between a supporting member and a reflective member or layer facing in the vertical direction. The light source 100 may emit light in at least one direction or may emit light in a plurality of directions. Each side of the lighting device 200 may have the same thickness or the same height as each other. The light source 100 may be sealed by a layer of a transparent resin material, and the layer of the resin material may be disposed between layers of a reflective material or between a supporting member and a reflective layer or member.

The substrate 210 may include a printed circuit board (PCB), for example, a resin-based printed circuit board (PCB), a metal core PCB, a flexible PCB, and a ceramic PCB, or a FR-4 substrate. The substrate 210 may be a flexible or non-flexible substrate. A circuit pattern may be disposed on the substrate 210, and the circuit pattern may include a plurality of pads in a region corresponding to the light source 100. The circuit pattern in the substrate 210 may be disposed on an upper portion, or may be disposed on an upper portion and a lower portion thereof.

The resin layer 220 may be disposed on the light sources 100. The resin layer 220 may be disposed on each side of the light source 100, between adjacent light sources 100, or on upper portion of each of the light sources 100. The resin layer 220 may be disposed on the substrate 210. The resin layer 220 may be disposed between the substrate 210 and the first reflective layer 240. The resin layer 220 may be disposed between the upper surface of the substrate 210 and the lower surface of the first reflective layer 240. The resin layer 220 may surround the plurality of light sources 100 disposed on the substrate 210 or may bury the light sources 100. The resin layer 220 may be a light-transmitting layer. The resin layer 220 may include a glass material as another material. The plurality of light sources 100 may be arranged in n numbers (n≥2) in the first row or along an imaginary line. Since the thickness of the resin layer 220 is provided to be smaller than the thickness of the lighting device 200, the width of the line light may be smaller. That is, the width of the line light source may be the thickness of the resin layer

220. The resin layer 220 may include a first surface S1 and a second surface S2 disposed on opposite sides of each other, and a third surface S3 and a fourth surface S4 disposed on opposite sides of each other. As shown in FIG. 4, the first and second surfaces S1 and S2 may be disposed to correspond to each other in the first direction Y, and the third and fourth surfaces S3 and S4 may be disposed to correspond to each other in the second direction X. The first and second surfaces S1 and S2 may be disposed to correspond to each other based on an imaginary line connecting the plurality of light sources 100. The third and fourth surfaces S3 and S4 may be disposed more outside than the outermost light source among the plurality of light sources 100. As another example, as shown in FIG. 5, the first and second surfaces S1 and S2 extend along an imaginary line and may be disposed on opposite sides with respect to the plurality of light sources 100.

Each outer surface of the lighting device 200 may be each side of the resin layer 220 having the thickest thickness in the lighting device 200. The outer surfaces S1, S2, S3, and S4 of the resin layer 220 may be disposed in a direction perpendicular to each side of the substrate 210, the second reflective layer 230, and the first reflective layer 240 or in the same plane. As another example, at least one of the outer surfaces S1, S2, S3, and S4 of the resin layer 220 may be provided with the same plane as each side of the substrate 210, the second reflective layer 230 and the first reflective layer 240, or provided with an inclined surface. The first and second surfaces S1 and S2 may extend from both ends of the third and fourth surfaces S3 and S4 in the second direction X. The first surface S1 may face the second surface S2 and may include a curved surface. The first surface S1 may be a surface in a direction in which light is emitted from the plurality of light sources 100, and the second surface S2 may be a surface in a direction opposite to the direction in which light is emitted from the plurality of light sources 200. The third surface S3 may be an outer surface adjacent to a light source placed first, and the fourth surface S4 may be an outer surface adjacent to the last light source. The plurality of light sources 100 may be disposed between the first surface S1 and the second surface S2. The plurality of light sources 100 may be disposed between the third surface S3 and the fourth surface S4. In the resin layer 220, a length in the second direction X of the first surface S1 and the second surface S2 may be greater than a height or thickness in a vertical direction. The maximum length in the second direction X of the first surface S1 and the second surface S2 may be the same or different from each other. The first surface S1 and the second surface S2 may have the same height or thickness in a vertical direction. The height or thickness of the third surface S3 and the fourth surface S4 in the vertical direction may be the same as the height or thickness of the first surface S1 and the second surface S2 in the vertical direction. In the resin layer 220, the first surface S1 and the second surface S2 may be side surfaces having a long length in the second direction X. The third surface S3 and the fourth surface S4 may be side surfaces having a long length in the first direction Y. The first surface S1 faces to an emission portion 111 of the light source 100 or is exposed in the second direction X from the first ends of the third surface S3 and the fourth surface S4. The second surface S2 may be a surface facing the rear surfaces of the plurality of light sources 100 or a surface exposed in the second direction X from the second ends of the third surface S1 and the fourth surface S4. The third and fourth surfaces S3 and S4 may be different from the first and second surfaces S1 and S2. The rear surface of the light source 100 may be a surface opposite to the emission portion 111 or a surface facing to the second surface S2.

The emission portion 111 of each of the plurality of light sources 100 may face to the first surface S1. The light emitted from the light source 100 may be emitted through the first surface S1, and some light may be emitted through at least one of the second surface S2, the third surface S3, and the fourth surface S4. That is, most of the light emitted from the light source 100 may be emitted through the first surface S1. In the lighting device 200, the maximum lengths Y1 and X1 in the first and second directions may be the maximum lengths in the first and second directions Y and X of the resin layer 220. Accordingly, the light source in the form of a line may be emitted through the first surface S1 of the resin layer 220. The thickness of the first surface S1 of the resin layer 220 is the thickness of the resin layer 220, and may be less than 3 mm. The first surface S1 of the resin layer 220 may be an exit surface from which the light emitted from the light source 100 is emitted. The first surface S1 may be a front surface or an emission surface, and the second surface S2 may be a rear surface or a non-exit surface. The first surface S1 may extend in a vertical direction in a structure in which a plane has a convex portion P0 and a recess portion C0 along the second direction X. As another example, the first surface S1 may be a curved surface convex with respect to a vertical direction, an inclined structure protruding from the upped end to the lower end, or an inclined structure protruding from the lower end to the upper end. The first surface S1 may have a regular concave-convex shape or a side surface in which concave-convex structures are arranged. The first surface S1 may be a region having a larger surface area than that of the opposite second surface S2. The first surface S1 may include a plurality of convex surfaces S11 corresponding to each light source 100 and a plurality of concave surfaces S12 respectively disposed between the plurality of convex surfaces S11. The resin layer 220 may include a plurality of convex portions P0 having a convex surface S11 and protruding from the first surface S1. The convex portion P0 may include a convex surface S11 convex in a direction of the first surface S1 or the emission direction, or a lens surface. The convex surface S11 may be provided as a convex lens portion. In the resin layer 220, a concave surface S12 may be disposed in a region between the convex portions P0 on the first surface S1. The concave surface S12 may be a concave surface or may include a flat surface. The resin layer 220 or the lighting device 200 may include a recess portion C0 recessed in the direction of the second surface S2 in a region between the convex portions P0. The recess portion C0 may overlap the region of the concave surface S12 in the second direction X. The recess portions C0 may be respectively disposed between the convex portions P0. The recess portion C0 may be spaced apart from the third and fourth surfaces S3 and S4. The recess portion C0 may include the concave surface S12 disposed in a region between the convex portions P0. Here, the first surface S1 may be defined as an emission surface because light may be emitted from the entire region. The convex surface S11 and the concave surface S12 may be alternately disposed. The convex portion P0 and the recess portion C0 may be alternately disposed. A surface disposed on the outermost side of the first surface S1 in the second direction X may be a portion of the convex surface S11. The outermost convex surface S11 may extend from the third surface S3 or from the fourth surface S4. A center of each of the plurality of convex surfaces S11 may be disposed at a position corresponding to the center of each of the plurality of light sources 100 in the first direction Y. A center of each of the plurality of convex portions P0 may be disposed at a position corresponding to the center of each of the plurality of light sources 100 in the first direction Y. Each of the plurality of light sources 100 may overlap each of the convex portions P0 in the first direction Y. Each of the plurality of light sources 100 may overlap the convex surface S11 in the first direction Y and may not overlap the concave surface S12 in the first direction Y. Each of the plurality of light sources 100 may not overlap the recess portion C0 in the first direction Y. A height in a vertical direction of the convex surface S11 may be the same as a thickness in a vertical direction of the resin layer 220. A height in a vertical direction of the concave surface S12 may be the same as a thickness in a vertical direction of the resin layer 220. The resin layer 220 may cover or mold the light source 100. Each of the light sources 100 may include a light emitting chip. The light source 100 may include a reflective sidewall surrounding the outside of the light emitting chip, for example, a body. The reflective sidewall may have a structure in which a region facing the first surface S1 of the resin layer 220 is opened and surrounds the periphery of the light emitting chip. The reflective sidewall may be a portion of the light source 100 or may be separately provided with a reflective material. Sides of the light source 100 except for the emission portion 111 may be formed of a reflective material or a transparent or opaque material. The resin layer 220 may have a refractive index of 1.70 or less, for example, in a range of 1.25 to 1.70. When the refractive index of the resin layer 220 is out of the above range, light extraction efficiency may be reduced.

Each of the light sources 100 may have a bonding portion disposed thereunder and may be electrically connected to the pad of the substrate 210. The light sources 100 may be connected in series by a circuit pattern of the substrate 210 or may be in series-parallel, parallel-series or parallel. As another example, the light sources 100 may be arranged in various connection groups by a circuit pattern of the substrate 210. The light source 100 may include a device having a light emitting chip or a package in which an LED chip is packaged. The light emitting chip may emit at least one of blue, red, green, and ultraviolet (UV) light. The light source 100 may emit at least one of white, blue, red, and green. The light source 100 emits light in a lateral direction and has a bottom portion disposed on the substrate 210. The light source 100 may be a side view type package. As another example, the light source 100 may be an LED chip, and one surface of the LED chip may be opened and a reflective member may be disposed on the other surface. The light source 100 may include a phosphor. The light source 100 may include a phosphor layer or a molding member covering the surface of the light emitting chip. The phosphor layer may be a layer to which a phosphor is added, and the molding member may be a transparent resin member having phosphor or a transparent resin member free of impurities such as phosphor.

As shown in FIG. 4, the maximum distance D2 between the light source 100 and the first surface S1 with respect to the light source 100 may be different from the distance D3 between the light source 100 and the second surface S2. The distance D3 between the light source 100 and the second surface S2 may be 2 mm or more, for example, in the range of 2 mm to 20 mm. when the distance D3 between the light source 100 and the second surface S2 is smaller than the above range, the region in which moisture may penetrate or form a circuit pattern may be reduced, and when it is larger than the above range, a size of the lighting device 200 may be increased. The maximum distance D2 may be a maximum distance between the convex surface S11 and the light source 100 or a linear distance between the light source 100 and the vertex of the convex portion P0. The maximum distance D2 may be 5 mm or more, for example, in the range of 5 mm to 20 mm or in the range of 8 mm to 20 mm. When the maximum distance D2 is smaller than the above range, a hot spot may be generated, and when it is larger than the above range, the module size may be increased. When the plurality of light sources 100 are arranged on the same straight line, the distance D1 between the straight line connecting the adjacent concave surfaces S12 and each light source 100 is 5 mm or more, for example, in the range of 5 mm to 12 mm. In addition, when the distance D1 is smaller than the above range, the depth D4 of the recess portion C0 may increase or the maximum distance D2 may become narrower, so that dark portions may be generated in the recess portions C0. The distance D1 may vary depending on the light beam angle of each of the light sources 100. That is, when the distance between the straight line connecting both ends of the convex portion P0 and each of the light sources 100 is too close, light may be condensed to the center region of the convex surface S11, and when it is far away, light may be irradiated to the concave surface S12, so that the luminous intensity through the convex surface S11 may be reduced. The interval W1 between the recess portions C0 or between the concave surfaces S12 in the first direction Y is a linear distance between the adjacent recess portions C0, and is equal to or smaller than the interval G1 between the light sources 100. When the interval W1 is greater than the interval G1 between the light sources 100, two or more light sources 100 are located in the convex portion P0 to increase the luminous intensity, but there may be difficulties in controlling the light distribution. When the interval W1 is smaller than the distance G1 between the light sources 100, the size of the convex portion P0 is small, thereby providing a uniform distribution of light, but the luminous intensity may be reduced.

The interval W1 between the recess portions C0 may be 15 mm or more, for example, in a range of 15 mm to 20 mm. The interval W1 between the recess portions C0 may be greater than the depth D4 of the recess portions C0. A ratio of the interval W1 of the recess portion C0 to the depth D4 of the recess portion C0 may be in a range of 1:0.4 to 1:0.7. When the depth of the recess portion C0 is smaller than the above range, a region of the dark portion between the adjacent convex portions P0 may be increased. When the depth of the recess portion C0 is greater than the above range, it may extend to a region adjacent to the light source 100, thereby increasing light interference between the light sources 100. The depth D4 of the recess portion C0 may be a straight-line distance between the lower point of the recess portion C0 from a straight line connecting the vertices of the convex portions P0. The second reflective layer 230 may be disposed between the resin layer 220 and the substrate 210. The resin layer 220 may be in contact with the upper surface and side surfaces of each of the light sources 100. The resin layer 220 may be in contact with an upper surface of the second reflective layer 230. A portion of the resin layer 220 may be in contact with the substrate 210 through a hole in the second reflective layer 230. The resin layer 220 may be in contact with the emission portion 111 of each of the light sources 100. The first surface S1, the second surface S2, the third surface S3, and the fourth surface S4 of the resin layer 220 are outer surfaces between the first and second reflective layers 240 and 230. An upper surface of the resin layer 220 may be in contact with the first reflective layer 240, and a lower surface of the resin layer 220 may be in contact with the second reflective layer 230. The upper and lower surfaces of the resin layer 220 may be a horizontal plane or a surface having a curvature. When there is no the second reflective layer 230, the lower surface of the resin layer 220 may be in contact with the substrate 210.

The area of the lower surface of the resin layer 220 may be the same as the area of the upper surface of the substrate 210. The area of the lower surface of the resin layer 220 may be the same as the area of the upper surface of the second reflective layer 230. The area of the upper surface of the resin layer 220 may be the same as the area of the upper surface of the first reflective layer 240. A length of the resin layer 220 in the second direction X may be the same as a length (e.g., X1) of the substrate 210. The maximum length of the resin layer 220 in the second direction X may be the same as the maximum length of the second reflective layer 230 or the first reflective layer 240. A maximum length (e.g., Y1) of the resin layer 220 in the first direction Y may be the same as a maximum length of the substrate 210. A maximum length (e.g., Y1) of the resin layer 220 in the first direction Y may be the same as a maximum length of the second reflective layer 230. The maximum length (e.g., Y1) of the resin layer 220 in the first direction Y may be the same as the maximum length of the first reflective layer 240. The minimum length of the resin layer 220 in the first direction Y may be the same as the minimum length of the substrate 210. The minimum length of the resin layer 220 in the first direction Y may be the same as the minimum length of the second reflective layer 230 or the first reflective layer 240. The maximum length Y1 in the first direction Y may be the maximum distance between the apex (or high point) of the convex portion P0 of the lighting device and the second surface S2, and the minimum length may be the minimum distance between the lower point of the concave surface S12 and the second surface S2 of the lighting device.

A resin layer 220 may be disposed in a region between the first and second reflective layers 240 and 230. The first and second reflective layers 240 and 230 may have the same area and may face the upper and lower surfaces of the resin layer 220. Accordingly, the resin layer 220 may diffuse the light emitted from the light source 100 and the light reflected by the first and second reflective layers 240 and 230 to guide and emit the light in the direction of the first surface S1. The second reflective layer 230 may reflect the light emitted from the light source 100. The second reflective layer 230 may be formed as an upper layer of the substrate 210 or as a separate layer. The second reflective layer 230 may be adhered to the upper surface of the substrate 210 with an adhesive. The resin layer 220 may be adhered to the upper surface of the second reflective layer 230. The second reflective layer 230 has a plurality of holes 232 in a region corresponding to the lower surface of the light source 100, and the light source 100 may be connected to the substrate 210 through the holes 232. A portion of the resin layer 220 may be in contact with the substrate 210 through the hole 232. The hole 232 may be a region in which the light source 100 is bonded to the substrate 210. The second reflective layer 230 may have a single-layer or multi-layer structure. The second reflective layer 230 may include a material that reflects light, for example, a metal or a non-metal material. When the second reflective layer 230 is a metal, it may include a metal layer such as stainless steel, aluminum (Al), or silver (Ag), and in the case of a non-metal, it may include a white resin material or a plastic material. The second reflective layer 230 may include a white resin material or a polyester (PET) material. The second reflective layer 230 may include at least one of a low reflection film, a high reflection film, a diffuse reflection film, and a regular reflection film. The second reflective layer 230 may be provided as, for example, a specular reflective film for reflecting incident light to the first surface S1.

As shown in FIG. 2, the thickness Zc of the second reflective layer 230 may be smaller than the thickness Za of the substrate 210. The thickness Zc of the second reflective layer 230 may be 0.5 times or more and less than 1 times the thickness Za of the substrate 210, thereby reducing the transmission loss of incident light. The thickness Zc of the second reflective layer 230 may be in the range of 0.2 mm to 0.4 mm, and when it is smaller than the above range, light transmission loss may occur, and when it is thicker than the above range, the thickness Z1 of the lighting device 200 may increase. The first reflective layer 240 may be disposed on the entire upper surface of the resin layer 220, thereby reducing light loss. The resin layer 220 may be formed to a thickness Zb that is thicker than that of the light source 100. Here, the thickness of the light source 100 is a length in the vertical direction of the light source 100 and may be smaller than the length (K1, see in FIG. 4) in the second direction X. The thickness of the light source 100 may be 3 mm or less, for example, 2 mm or less. The thickness of the light source 100 may be in the range of 1 mm to 2 mm, for example, in the range of 1.2 mm to 1.8 mm. A portion of the resin layer 220 may be disposed between each of the light sources 100 and the first reflective layer 240. Accordingly, the resin layer 220 may protect the upper portion of each light source 100 and prevent moisture penetration. Since the substrate 210 is disposed on the lower portion of the light source 100 and the resin layer 220 is disposed on the upper portion of the light source 100, upper and lower portions of each light source 100 may be protected. Accordingly, the interval between the upper surface of the resin layer 220 and the upper surface of each light source 100 may be 0.6 mm or less, for example, in the range of 0.5 mm to 0.6 mm. An upper portion of the resin layer 220 may extend to an upper portion of each light source 100 to protect an upper portion of the light source 100. The thickness Zb of the resin layer 220 may be an interval between the upper and lower surfaces of the resin layer 220. The thickness Zb of the resin layer 220 may be a vertical distance between the first and second reflective layers 240 and 230. The thickness Zb may be equal to the distance between the first and second reflective layers 240 and 230. The thickness Zb may be smaller than a distance between the first surface S1 and the second surface S2. For example, a distance between the first surface S1 and the second surface S2 may include a maximum length Y1 and a minimum length. The maximum length Y1 in the first direction Y may be a linear distance between the apex of the convex portion P0 and the second surface S2. A distance or an interval between the third and fourth surfaces S3 and S4 of the resin layer 220 may be greater than a distance between the apex of the convex portion P0 and the second surface S2. The minimum length in the first direction Y may be a linear distance between the concave surface S12 and the second surface S2. The distance or interval between the second reflective layer 230 and the first reflective layer 240 may be smaller than the distance or interval between the first surface S1 and the second surface S2 of the resin layer 220. Since the distance between the first and second reflective layers 240 and 230 may have smaller than the length or minimum width in the first direction Y of the lighting device 200, the surface light source in the form of a line may provide through the first direction Y, it may improve a luminous intensity and prevent hot spots. In addition, the lighting device may have a constant thickness and may be provided with a flexible characteristic that may be convex or concave in the third direction Z. The thickness Zb of the resin layer 220 may be less than twice the thickness of the light source 100, for example, more than 1 time to less than 2 times the thickness of the light source 100. The thickness Zb of the resin layer 220 may be 2 mm or less, for example, in the range of 1.5 mm to 1.9 mm or in the range of 1.6 mm to 1.8 mm. The thickness Zb of the resin layer 220 may be 0.8 times or less of the thickness Z1 of the lighting device 200, for example, in a range of 0.4 times to 0.8 times the thickness Z1 of the lighting device 200. Since a thickness of the resin layer 220 may have a difference of 1.2 mm or less from the thickness Z1 of the lighting device 200, a decreased in a light efficiency in the lighting device 200 may be prevented and ductility characteristics may be enhanced. As shown in FIG. 4, the length K1 in the second direction X of each light source 100 may be 2 mm or more, for example, in a range of 2 mm to 7 mm. The length K1 of each light source 100 is the length of the long side, the length smaller than the width of each convex portion 100, and may be greater than the thickness of the light source.

A thickness Zb of the resin layer 220 may be smaller than a length or a maximum length in the second direction X of each of the light sources 100. The thickness Zb of the resin layer 220 may be smaller than the maximum length of the convex surface S11 in the second direction X. That is, by providing the thickness Zb of the slim resin layer 220, a surface light source having a line shape, for example, a line width of 3 mm or less, may be provided through the first surface S1 in one direction. The convex surface S11 or the convex portion P0 may have a first curvature. The concave surface S12 may be flat or have a greater curvature than the first curvature. Here, the radius of curvature of the convex portion P0 may be 5 mm or more, for example, in a range of 5 mm to 15 mm, or in a range of 8 mm to 11 mm. That is, the radius of curvature of the virtual circle formed by the convex portion P0 may be 5 mm or more, for example, in a range of 5 mm to 15 mm, or in a range of 8 mm to 11 mm. When the radius of curvature of each of the convex portions P0 is smaller than the above range, the improvement in luminous intensity is insignificant.

A radius of curvature of at least one, or two or more of the concave surfaces S12 may be less than or equal to 0.12 times smaller than a radius of curvature of the convex portion P0. A ratio of the radius of curvature of the concave surface S12 to the radius of curvature of the convex portion P0 may be in the range of 1:8 to 1:28. When the radius of curvature of the concave surface S12 is smaller than the above range, the amount of light emitted through the concave surface S12 is reduced and the dark portion is increased, and it is greater than the above range, the size of the convex portion P0 may be decreased and an optical interference between the light sources 100 may occur. Accordingly, the depth D4 and the radius of curvature of the concave surface S12 may consider the position of the light source 100 and an angle of beam spread of the light source 100, and may be a range for improving light uniformity through the convex portion P0 and the recess portion C0 and suppressing dark portion on the recess portions C0. The radius of curvature of the concave surface S12 may be in the range of 1.2 mm or less, for example, in a range of 0.5 mm to 1.2 mm. Since the concave surface S12 has a predetermined curvature and is provided in a curved shape, it is possible to refract and transmit incident light, thereby reducing the occurrence of dark portions on a region of the recess portion.

Meanwhile, the resin layer 220 may include a resin material such as silicone, silicone molding compound (SMC), epoxy, or epoxy molding compound (EMC). The resin layer 220 may include a UV (ultra violet) curable resin or a thermosetting resin material, for example, may selectively include PC, OPS, PMMA, PVC, and the like. For example, the main material of the resin layer 220 may be a resin material having a urethane acrylate oligomer as a main material. For example, a mixture of urethane acrylate oligomer, which is a synthetic oligomer, and a polymer type, which is polyacrylic. Of course, there may further include a mixed monomer with low-boiling dilution-type reactive monomer IBOA (isobornyl acrylate), HPA (Hydroxylpropyl acrylate, 2-HEA (2-hydroxyethyl acrylate), etc., and may be mixed a photoinitiator (for example, 1-hydroxycyclohexyl phenyl-ketone, etc.) or antioxidants as an additive. A bead (not shown) may be included in the resin layer 220, and the bead may diffuse and reflect the incident light, thereby increasing the amount of light. The resin layer 220 may include a phosphor. The phosphor may include at least one of yellow, green, blue, or red phosphor. The lens portion of the resin layer 220 is provided in a lens shape having a convex convex surface, and may include a hemispherical shape, a semicircular shape, a semi-elliptical shape, or an aspherical shape when viewed from a top view. The lens portion may include a collimator lens. The closer the lens portion is to the peak corresponding to the center of the light source 100, the further the distance between the lens portion and the light source 105. The thickness of the lens portion in the third direction Z may be the thickness of the resin layer 220. Since the lens portion has flat upper and lower surfaces and has curved surface in a direction of the first surface S1, it is possible to diffuse light incident in a direction of the first surface S1. The lens portion may be disposed between the first and second flat reflective layers 240 and 230 on the upper and lower portions thereof, and may refract light to the first surface S1 and emit the light. The lens portion may refract light incident to a region deviating from the optical axis with respect to the optical axis at an exit angle greater than an incidence angle. When the lighting device 200 has a curve due to its ductility, the resin layer 220 and the first and second reflective layers 240 and 230 may include curved regions instead of being flat.

Accordingly, each of the convex surfaces S11 of the resin layer 220 may emit light emitted from each of the respective light sources 100. The recess portion C0 disposed between the convex portions P0 in the resin layer 220 may be provided as a recess recessed in a direction of the second surface S2. The recess portion C0 of the resin layer 220 may be formed on the concave surface S12 of the resin layer 220. Since the light emitted from each light source 100 is emitted from the region between the convex portions P0 through the recess portion C0, the occurrence of dark portions in the recess portion C0 may be reduced. Here, when the convex portion P0 and the recess portion C0 are disposed on the resin layer 220, the substrate 210 and the first and second reflective layers 240 and 230 may be provided in a shape corresponding to the convex portion P0 and the recess portion C0 in one side direction. The number of the convex portions P0 or the lens portions of the resin layer 220 may be the same as the number of the respective light sources 100. The first reflective layer 240 may be made of the same material as the second reflective layer 230. In order to reflect light and reduce transmission loss of light, the first reflective layer 240 may be made of a material having a higher light reflectance than that of the second reflective layer 230 or may have a thicker thickness. The first reflective layer 240 may have a thickness equal to or greater than the thickness Zc of the second reflective layer 230. For example, the first and second reflective layers 240 and 230 may be provided with the same material and the same thickness. The thickness Zd of the first reflective layer 240 may be equal to or smaller than the thickness Za of the substrate 210. The thickness Zd of the first reflective layer 240 may be 0.5 times or more of the thickness Za of the substrate 210, for example, in the range of 0.5 to 1 time, to reduce transmission loss of incident light. The thickness Zd of the first reflective layer 240 may be in the range of 0.2 mm to 0.4 mm, and when it is smaller than the above range, light transmission loss may occur, and when it is thicker than the above range, the thickness Z1 of the lighting device 200 may increase. The first reflective layer 240 may have a single-layer or multi-layer structure. The first reflective layer 240 may include a material that reflects light, for example, a metal or a non-metal material. When the first reflective layer 240 is a metal, it may include a metal layer such as stainless steel, aluminum (Al), or silver (Ag), and in the case of a non-metallic material, it may include a white resin material or a plastic material. The first reflective layer 240 may include a white resin material or a polyester (PET) material. The first reflective layer 240 may include at least one of a low reflection film, a high reflection film, a diffuse reflection film, and a regular reflection film. The first reflective layer 240 may be provided as a specular reflective film so that, for example, incident light travels in the direction of the first surface S1. The first and second reflective layers 240 and 230 may be made of the same material or different materials. The substrate 210 and the first and second reflective layers 240 and 230 may include convex portions and recess portions of the resin layer 220. That is, a convex portion of the substrate 210 and the first and second reflective layers 240 and 230 are disposed on the upper and lower surfaces of the convex portion P0 of the resin layer 220, and a recess portion of the substrate 210 and the first and second reflective layers 240 and 230 are disposed on the recess portion. Accordingly, the stacked structure of the substrate 210, the second reflective layer 230, the resin layer 220, and the first reflective layer 240 may include the same structure as the convex portion P0 and the recess portion C0 in one direction. The convex portion P0 has a flat upper surface and a flat lower surface, and may include a curved surface or a hemispherical shape in the first direction Y. The recess portion C0 may include a flat or concave curved surface in the direction of the second surface S2. At least one or both of the convex surface S11 and the concave surface S12 of the resin layer 220 may be treated as a haze surface, thereby diffusing light. The haze surface may be formed as a surface rougher than the inner surface of the resin layer 220 to diffuse the emitted light.

Here, as shown in FIG. 4, the light source 100 may be positioned in a region of a virtual circle Vc formed by each of the convex portions P0. That is, the maximum distance D2 between the convex portion P0 and the light source 100 may be smaller than the diameter r0 of the virtual circle Vc. At this time, since the light is emitted in the distribution angle of the light beam through each convex portion P0 disposed on the virtual circle that satisfies the maximum distance D2 from the light source 100, more light may be focused on the target region or in the direction in which the light travels. The lighting device 200 according to an embodiment of the invention may provide the thickness Z1 in the third direction Z in the form of a line, thereby providing a degree of freedom in the design of the line light source and stable lighting. Also, it is possible to improve the uniformity of the entire line light source. The thickness Z1 of the lighting device 200 may be 3 mm or less, for example, 3 mm or less, or may be in the range of 2.4 mm to 3 mm. In addition, since the thickness of the resin layer 220 may be less than 3 mm, for example, in the range of 1.5 mm to 1.9 mm, the width of the line-shaped surface light source may be further narrowed. As another example, the lighting device 200 may be disposed in a range of 2 mm to 6 mm. In this case, the thickness of the resin layer 220 may be increased to increase the line width and increase the light distribution region. The lighting device 200 having the line light source may be applied to a vehicle lamp, for example, a side lamp, a side mirror lamp, a fog lamp, a tail lamp, a brake lamp, an auxiliary brake lamp, a turn indicator lamp, a position lamp, a daytime running lamp, a vehicle interior lighting, a door scar, a rear combination lamp (RCL), a backup lamp, a room lamp, and an instrument panel lighting may be selectively applied. The rear combination lamp may include a brake light, a tail light, a turn indicator light, and a reversing light. Among the above lamps, a lamp having a curved shape along a car line may be provided.

In the lighting device disclosed in the first embodiment, a plurality of light sources 100 are disposed on the same straight line, and a line-shaped surface light source emitted through each of the convex portions P0 is irradiated in a front direction. In this case, when an imaginary straight line connecting each of the convex portions P0 and the target region face each other, light may be effectively irradiated to the target region. In this case, the target region may have a linear structure disposed at equal intervals to each of the convex portions P0. For example, the target region may include a lens, for example, an inner lens or an outer lens. The number of light sources 100 may be the same as the number of convex portions P0, and may be arranged in the range of two or more, for example, in a range of 2 to 100 or in a range of 3 to 40 along the second direction X. That is, two or three or more light sources 100 may be arranged between the third surface S3 and the fourth surface S4. The arrangement number of such light sources 100 may vary depending on the installation environment or target lighting.

On the other hand, when the lamp line of the target region (e.g., car line) to which light is irradiated from the lighting device is provided as a curved line or a curved line, an imaginary line connecting a plurality of convex portions or an imaginary line connecting a plurality of light sources may be provided as a curved structure or an inclined line according to the ramp line of the target region. The second embodiment includes the configuration of the first embodiment, and is an example in which the position of the light source and the position of the convex portion are modified. In describing the second embodiment, the same configuration as that of the first embodiment will be referred to the description of the first embodiment.

Figure 6:
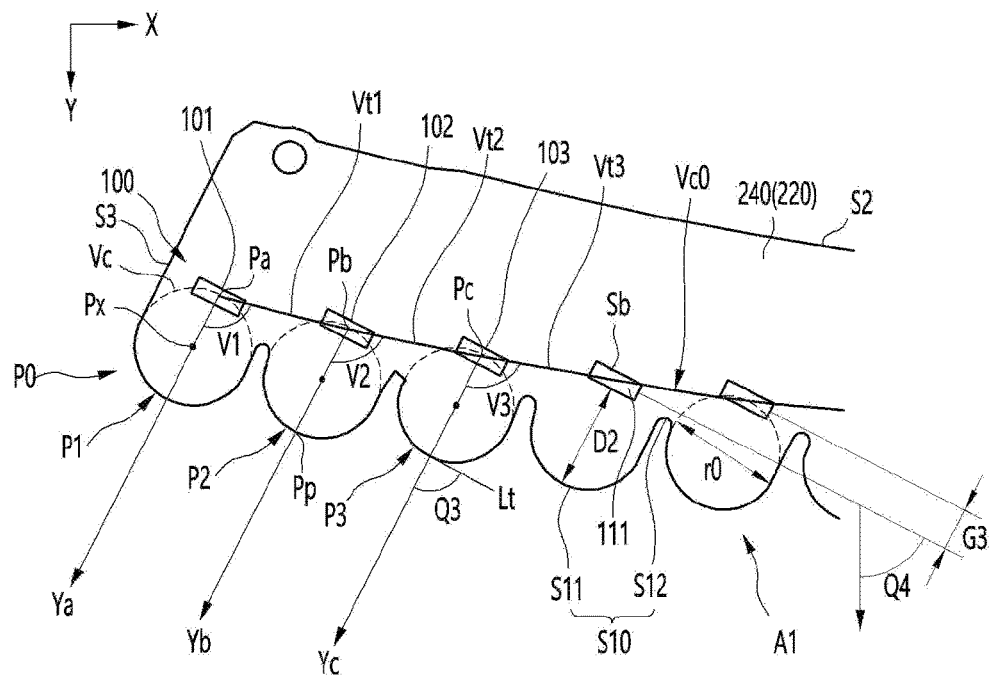
FIG. 6 is an enlarged view of a first region A1 of the lighting device of FIG. 5.
Figure 7:
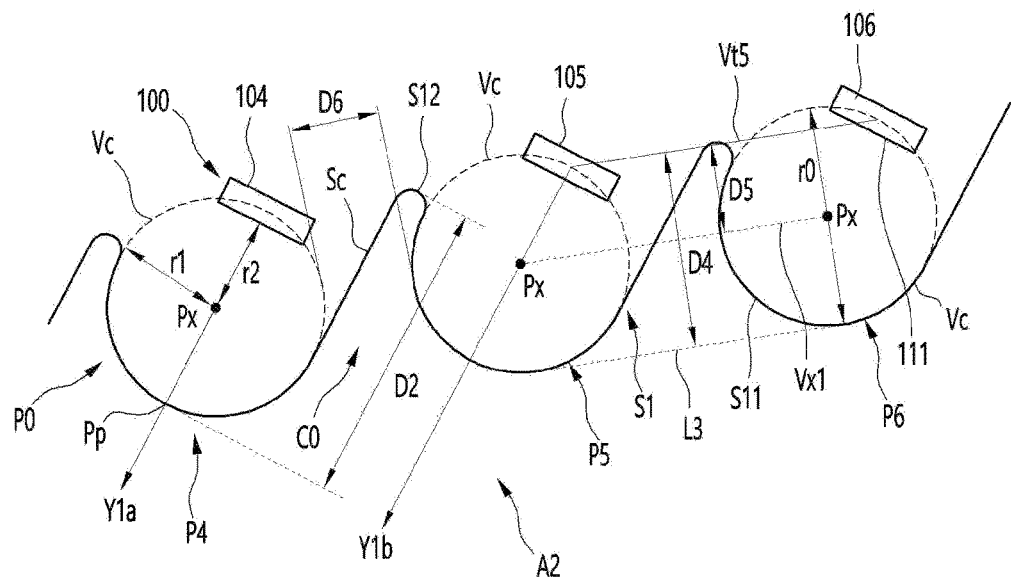
FIG. 7 is a partially enlarged view of a second region A2 of the lighting device of FIG. 5.
Figure 8:
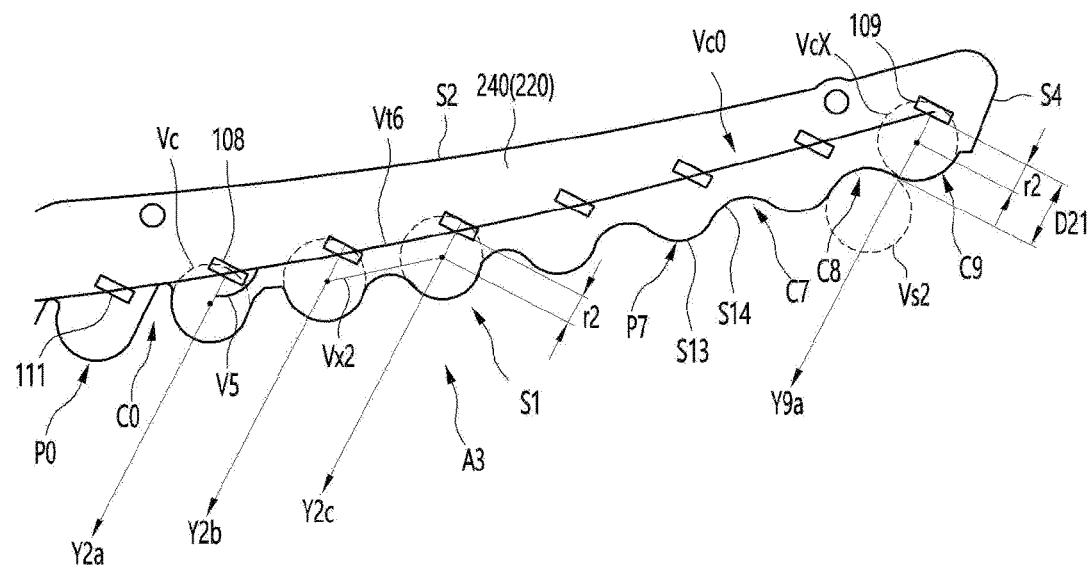
FIG. 8 is an enlarged view of a third region A3 of the lighting device of FIG. 5.

FIG. 5 is an example of a plan view of the lighting device according to the second embodiment, FIG. 6 is an enlarged view of a first region A1 of the lighting device of FIG. 5, and FIG. 7 is an enlarged view of a second region A2 of the lighting device of FIG. 5, and FIG. 8 is an enlarged view of the third region A3 of the lighting device of FIG. 5. The lighting device shown in FIGS. 4 to 8 is a plan view viewed from the resin layer 220 or the first reflective layer 240.

Referring to FIGS. 5 to 8, the lighting device 200 may include a substrate 210, a light source 100, a first reflective layer 240, and a resin layer 220, as shown in FIG. 2. A second reflective layer 230 may be disposed between the substrate 210 and the resin layer 220. The second reflective layer 230 may reflect light traveling on the substrate 210 in the direction of the substrate, and may be removed. The first and second reflective layers 240 and 230 reflect the light emitted through the plurality of light sources 100 in the resin layer 220, and the resin layer 220 guides the light and emits light through a first surface through S1. In the lighting device 200, the plurality of light sources 100 may be disposed along a virtual curve Vc0 with lines connected from the third surface S3 to the fourth surface S4 direction. The virtual curve Vc0 may pass through the plurality of light sources 100. The virtual curve Vc0 may pass through the center of each light source 100. The virtual curve Vc0 may have a convex or positive curvature toward the first surface with respect to a straight line L9 connecting the centers of the light source 101 (hereinafter referred to as a first light source) located at the first and the light source 109 (hereinafter referred to as a ninth light source) at the last among the plurality of light sources 100. Alternatively, the imaginary line passing through the plurality of light sources 100 may have a convex curve with respect to a straight line connecting the first light source 101 and the ninth light source 109, and may be convex in the direction of the first surface S1. A portion of the imaginary line passing through the plurality of light sources 100 may be disposed behind the second surface S2.

Lines connected from the third surface S3 to the fourth surface S4 with respect to the plurality of convex portions P0 along the arrangement direction of the plurality of light sources 100 may be arranged along a virtual curve Vc0. In FIG. 2, the first surface S1 of the resin layer 220 may include a plurality of convex portions P0 and a plurality of recess portions C0. The first surface S1 having the convex portion P0 and the recess portion C0 may be an exit surface. That is, the first surface S1 of the resin layer 220 may be an exit surface. In the resin layer 220, the first surface S1 or the exit surface may include a convex surface S11 and a concave surface S12. The convex surface S11 is an outer surface of the convex portion P0, and most of the light may be emitted. The concave surface S12 is a concave surface between the convex portions P0, and light may be emitted. As shown in FIGS. 1 and 2, the substrate 210, the first reflective layer 240, and the second reflective layer 230 may include a structure of a convex portion and a recess portion formed in the same manner as in the formation of the convex portion P0 and the recess portion C0 of the resin layer 220. This configuration will be referred to the description of FIGS. 1 to 4.

Here, an interior angle Q2 between a straight line L1 passing through two adjacent convex portions with respect to the first convex portion P1 corresponding to the first light source 101 and a straight line L2 passing through two adjacent convex portions with respect to the last ninth light source 109 may be an obtuse angle. An angle Q1 with a straight line L3 passing through two adjacent convex portions disposed in the center region A2 with respect to the straight line L1 may be greater than the angle Q2 and may be an acute angle. Here, the straight line L2 connecting the outermost convex portions may be provided at an angle of 70 degrees or less with respect to the straight line in the second direction X. The interior angle Q2 may be in the range of 91 degrees to 150 degrees, and may vary depending on a line of the housing or bracket of the applied lamp.

Here, the plurality of light sources 100 are positioned on the virtual curve Vc0. Each center of the plurality of light sources 100 may be disposed on a virtual curve Vc0. Intervals G1 and G2 between two straight lines orthogonal to two adjacent light sources 100 may be equal to each other. Each straight line orthogonal to each light source 100 may extend in a direction orthogonal to a long side among sides of the light source 100. A straight line orthogonal to the light source 100 may extend in an optical axis direction or a normal line direction with respect to the center of the light sources 100. The intervals G1 and G2 are equally arranged for uniform distribution of light, but may be arranged at different intervals, for example, the intervals G2 between light sources (e.g., 109) that are relatively more spaced apart from the straight line L3 of the center region may be arranged to be narrower than the interval G1. That is, for the uniformity of light, the intervals G1 and G2 of the light sources may be equal to each other, or may be made narrower interval in some region (e.g., A3) based on the center region (e.g., A2), or in a specific region (e.g., A1) may be made wider interval. For example, a difference between intervals between two light sources adjacent to the third and fourth surfaces S3 and S4 may have a difference of less than 10%. When the distance difference is greater than 10%, the difference in the uniformity of light between the light sources adjacent to the third and fourth surfaces S3 and S4 becomes large, and there is a problem in that the number of light sources is increased.

In the lighting device, each of the plurality of light sources 100 may be inclined or arranged with a slope with respect to the first or second direction Y and X. That is, the central axis direction of each light source 100 may be inclined with respect to the first direction Y. Accordingly, the intervals G3 and G4 between the straight lines extending the long sides of the two adjacent light sources may be horizontal intervals, an interval in the direction of the third surface S3 is the smallest, and an interval adjacent to the fourth surface S4 may gradually increase. That is, the interval G3<G4 may be satisfied. The long side of the light source 100 may be the side on which the emission portion 111 (refer to FIG. 2) is disposed or the opposite rear surface (Sb, see FIG. 6). That is, in the light sources 100, the horizontal interval G3 between two adjacent light sources 100 may gradually increase from the first light source 101 to the fourth surface S4 direction. The interval Gd between the perpendicular straight lines between the two adjacent light sources 100 may be equal to each other or may have a difference of less than 10%. Accordingly, when the lighting device is installed along the line of the vehicle lamp, it is possible to have a uniform distribution of the surface light source on each line. In addition, the lighting device may be provided as a line light source having a thickness of 3 mm or less, and may be provided as a flexible or non-flexible line light source.

The light source 100 may be disposed on a virtual curve Vc0. The virtual curve Vc0 may be disposed on straight lines connecting the centers of the plurality of light sources 100. In the plurality of light sources 100, straight lines connecting two adjacent light sources may have a slope with respect to the first direction Y or the second direction X. In a region (e.g., A1, A3) close to an edge of the lighting device 200, straight lines connecting two light sources adjacent to each other in the plurality of light sources 100 may have different slopes based on the first and second directions Y and X. Here, the slopes of the straight lines connecting the two light sources adjacent to the fourth surface S4 may be greater than the slopes of the straight lines connecting the two light sources adjacent to the third surface S3. As another example, at least two of the straight lines connecting the two adjacent light sources 100 may have the same slope. As another example, at least one or two or more of the straight lines connecting the two adjacent light sources 100 may have different slopes. Accordingly, the slope of the straight line connecting two adjacent light sources in the lighting device 200 may be different according to the regions A1, A2, and A3 of the light sources 100. That is, the slopes of the straight lines connecting the adjacent light sources 100 in each region A1, A2, and A3 of the lighting device may be different from each other. For example, the first region A1 may be a region in which a first group of light sources adjacent to the third surface S3 are disposed, and the second region A2 may be a region in which a second group of light sources on the center side are disposed, and the third region A3 may be a region in which a third group of light sources adjacent to the fourth surface S4 are disposed. The slopes of straight lines connecting the light sources of the first to third groups may be different from each other. The number of light sources in each group may be the same or different from each other. That is, the slopes may increase from the second region A2 to the first region A1 and increase toward the third region A3. In this case, in an increasing rate in the slopes, an increasing rate of the slopes of the straight lines extending from the second region A2 to the third region A3 may be greater than an increasing rate of the slopes of the straight lines extending from the second region A2 to the first region A1. The first region A1 may be, for example, a region closest to the center of the front or rear of the vehicle when the lighting device is applied to a vehicle lamp, and the third region A3 may be a region closest to both corners of the front or rear of the vehicle.

The convex portion P0 may include at least one of a hemispherical shape, a semi-elliptical shape, and a shape having an aspherical surface. The virtual circle Vc formed by the convex portion P0 may include at least one of a circular shape, an elliptical shape, and a ring shape having an aspherical surface. The radius of curvature or curvature of the concave surface S12 between the convex portions P0 may vary according to the regions A1, A2, and A3. The radius of curvature of the concave surface S12 in each region A1, A2, and A3 may increase in one direction or toward the fourth surface S4. The curvature of the concave surface S12 may become smaller toward one direction or the fourth surface S4. The difference between the curvature or radius of curvature between the convex portion P0 or the convex surface S11 and the concave surface S12 may be maximum in a region close to the third surface S3, and may be minimum in a region close to the fourth surface S4. In the lighting device, the maximum length Y1 of the third surface S3 may be greater than the length Y2 of the fourth surface S4. This may further reduce the length Y4 of the fourth surface S4 by arranging components such as circuit patterns or connectors behind the first and second regions A1 and A2 in the lighting device. A through hole H1 is disposed in the lighting device 200, and a fastening member such as a screw may be fastened to the through hole H1. On the second surface S2 of the lighting device 200, a portion protruding backward on a predetermined curve, for example, a portion to which a connector is connected may be provided.

Referring to FIGS. 6 and 5, in the lighting device 200, the plurality of convex portions P0 includes a first convex portion P1 facing the first light source 101, a second convex portion P2 facing the second light source 102, and a third convex portion P3 facing to the third light source 103. The light source 100 may be a light emitting device, and may include first to third light sources 101, 102, 103 or first to third light emitting devices. The first to third light sources 101, 102, and 103 may be disposed on a virtual curve Vc0. A point at which the virtual curve Vc0 is in contact with or intersecting the first light source 101 is a first point Pa, and a point at which the virtual curve Vc0 is in contact with or interesting the second light source 102 is a second point Pb, and a point in contact with or crossing the third light source 103 may be a third point Pc. A virtual circle Vc forming the first to third convex portions P1, P2, and P3 may be provided along the curvature of each of the first to third convex portions P1, P2, and P3. At this time, a first virtual straight line Ya passing through the first point Pa and the center Px of the virtual circle Vc of the first convex portion P1, and a second virtual straight line Yb passing through the second point Pb and the center Px of the virtual circle Vc of the second convex portion P2 may be parallel to each other. The second straight line Yb may be parallel to the third virtual straight line Yc passing through the center Px of the virtual circle of the third convex portion P3 and the third point Pc. That is, straight lines passing through the center of each of the light sources 100 and the center Px of each of the virtual circles Vc having the curvature of each of the convex portions may be parallel to each other. The first point Pa may be a point at which the center of the first light source 101 and the virtual curve Vc0 intersect. The second point Pb may be a point at which the center of the second light source 102 and the virtual curve Vc0 intersect. A first angle V1 between a first tangent line Vt1 crossing with the virtual curve Vc0 at the first point Pa and the first straight line Ya may be a first obtuse angle. A second angle V2 between a second tangent line Vt2 crossing the virtual curve Vc0 at the second point Pb and the second straight line Yb may be a second obtuse angle. A third angle V3 between a third tangent line Vt3 crossing with the virtual curve Vc0 at the third point Pc and the third straight line Yc may be a third obtuse angle. The first to third angles V1, V2, and V3 are obtuse angles and may be different from each other. For example, the sizes of the first to third angles V1, V2, and V3 may satisfy a relationship of V1<V2<V3. That is, the angle between each of the straight lines passing through the center (e.g., Px) of each convex portion P0 and each of the light sources 100 and each of tangent lines at a point where each of the plurality of light sources meets the virtual curve may increase toward on direction or the fourth surface direction, or may include a region in which the angle increases. The increased region may be at least one or all of the first to third regions A1, A2, and A3. The first to third tangent lines Vt1, Vt2, and Vt3 may be tangent line to the virtual curve Vc0 at each center of the first to third light sources 103, may be a straight line connecting the adjacent first and second light sources 101 and 102, may be a straight line connecting the adjacent second and third light sources 102 and 103, or a straight line connecting the third light source 103 and an adjacent light source. That is, the first to third tangents Vt1, Vt2, and Vt3 may extend in the same direction as a straight line connecting the two adjacent light sources 101, 102, and 103.

A portion of the light sources 100 may be disposed within the virtual circle Vc or a circumference constituting each of the convex portions P1, P2, and P3. For example, at least a portion of the first light source 101 may be disposed within the virtual circle Vc passing through the first convex portion P1. At least a portion of the second light source 102 may be disposed within the virtual circle Vc passing through the second convex portion P2. At least a portion of the third light source 103 may be disposed within the virtual circle Vc passing through the third convex portion P3. The virtual circle Vc constituting each of the convex portions P1, P2, and P3 may pass through each of the light sources 100 opposing the respective convex portions P1, P2, and P3. The circumference of the virtual circle Vc constituting each of the convex portions P1, P2, and P3 and each of the light sources 100 or the light emitting devices may be disposed to overlap or pass through, respectively. At least one of the light sources 100 or the light emitting devices may be disposed so as not to overlap the circumference of the virtual circle Vc constituting the respective convex portions P1, P2, and P3. A curvature of each of the convex portions P1, P2, and P3 may be the same as a curvature of the virtual circle Vc. The maximum width of each of the convex portions P1, P2, and P3 may be equal to or greater than the diameter r0 of the virtual circle Vc. A maximum distance D2 between each of the convex portions P1, P2, and P3 and the light source 100 may be smaller than a diameter r0 of the virtual circle Vc. In the first region A1, a maximum distance D2 between each of the convex portions P1, P2, and P3 and the light source 100 may be smaller than a maximum width of the convex portions P1, P2, and P3. Here, the diameter r0 of the virtual circle Vc formed by the convex portions P1, P2, and P3 may be greater than the thickness Zb of the resin layer 220 illustrated in FIG. 2. The first to third straight lines Ya, Yb, and Yc passing through the apexes Pp of the first to third convex portions P1, P2 and P3 may extend in a direction normal with respect to the tangent line Lt at the apexes Pp of the first to third convex portions P1, P2, and P3 and may have an angle Q3 of 90 degrees. This angle Q3 may be set in consideration of the directional characteristics of light and the target region. Here, the plurality of light sources 100 may be disposed at a tilted or inclined angle with respect to the first direction Y or the second direction X, for example, and may be disposed as an angle Q4 of less than 90 degrees with respect to the first direction Y. The angle Q4 may be 45 degrees or more and less than 90 degrees. Each of the plurality of light sources 100 may be tilted with the angle Q4 and may be arranged to be gradually shifted in the direction of the second surface. This may vary depending on the surface of the lamp's housing or bracket. The lower point of the concave surface S12 disposed between the convex surfaces S11 may be spaced apart from the virtual curve Vc0. The lower point of the concave surface S12 may be a point closest to the second surface S2 within the concave surface. The apex of the convex portion S11 may be the most protruding point within each convex portion or the point furthest from each light source 100. In the distance between the plurality of light sources 100 and the bottom of the concave surface S12, the lower point (or center) of the recess portion C0 between the first light source 101 and the second light source 102 may be disposed closer to the first light source 101 than the second light source 102. The lower point (or center) of the concave surface S12 between the second light source 102 and the third light source 103 may be disposed closer to the third light source 103 than the second light source 102. That is, from the third surface S3 to the fourth surface S4 direction, the lower point or the center of the concave surface S12 disposed between the two light sources 100 may be more adjacent to the light source 100 adjacent to the third surface S3 than the light source 100 adjacent to the fourth surface S4.

Referring to FIGS. 5 and 7, in the second region A2, the convex portion P0, for example, will be defined as fourth to sixth convex portions P4, P5, P6, and the light source 100, for example, will be defined as a fourth to the sixth light sources 104, 105, and 106. The height D4 of the convex portions P4, P5, and P6 in the second region A2 may be disposed at a depth equal to a distance between a straight line L3 connecting two adjacent convex portions and a straight line Vt5 connecting two adjacent light sources 104, 105 and 106. The height D4 of the convex portions P4, P5, and P6 may be smaller than the diameter r0 of the virtual circle Vc forming the respective convex portions P4, P5, and P6. A depth D2 of the recess portion C0 or the depth of the concave surface S12 is the distance from the apexes of the convex portions P4, P5, and P6 to the lower point of the concave surface S12, and a depth in the second region A2 may have the largest depth and a depth of the third region A3 may have the smallest depth. The maximum depth of the recess portion C0 is the distance D2 between the apexes of the fourth to sixth convex portions P4, P5, and P6 and the lower point of the recess portion C0, and may be greater than a diameter r0 of the virtual circle Vc. The depth of the recess portion C0 may be the smallest in the third region A3 and may be the largest in the second region A2. The depth of the recess portion C0 may be inversely proportional to the size of the slope of the straight line connecting the two adjacent light sources 100. The concave surface S12 disposed in the recess portion C0 may be disposed between the fourth and fifth light sources 104 and 105, or between the fifth light source 105 and the sixth light source 106, respectively. From the third surface S3 to the fourth surface S4 direction, the lower point or center of the concave surface S12 disposed between the two light sources 104, 105 and 106 may be more adjacent to the fifth light source 105 adjacent to the fourth surface S4 than the fourth light source 104 adjacent to the third surface S3. Among the convex surfaces S11, an extension portion Sc disposed in the direction of the fourth surface S4 with respect to the fourth light source 104 may face to the side surface of the fourth light source 104, and an extension portion Sc of the convex surface S11 disposed in the fourth surface S4 direction with respect to the fifth light source 105 may face to the fifth light source 105. Since the extension portion Sc of the convex surface S11 further extends in the direction of the second surface S2, optical interference between adjacent light sources 104, 105, and 106 may be reduced. A virtual curve Vc0 or a straight line Vt5 connecting the centers of the adjacent fourth to sixth light sources 104, 105, and 106 may contact the concave surface S12. Accordingly, it is possible to block the light emitted by the adjacent fourth to sixth light sources 104, 105, and 106 from being emitted through the convex portions of other light sources. Here, the extension portion Sc is a region outside the region of the virtual circle among the convex surface S11, and may be provided as a straight line or a flat section up to the concave surface S12. The straight line Vx1 connecting the centers Px of the virtual circle Vc constituting the fourth to sixth convex portions P4, P5, and P6 may be disposed between the straight line Vt5 connecting the light sources and the straight lines L3 connecting the apexes of the convex portion P4, P5 and P6. The straight line Vx1 and the straight line L3 may be parallel. The straight line Vx1 and the straight line Vt5 may be parallel. The straight line Vx1 connecting the centers Px of the virtual circle Vc in the first and second regions A1 and A2 may be disposed in a convex direction rather than a straight line connecting the concave surfaces S12. As shown in FIG. 8, the straight line Vx2 connecting the centers Px of the virtual circle Vc in the third region A3 may be disposed closer to the second surface direction than the straight line connecting the concave surfaces S14.

As shown in FIG. 7, the distance D5 between the concave surface S12 and the straight line connecting the centers Px of the virtual circle Vc may be smaller than the radius r1 of the virtual circle Vc. This distance D5 has a structure in consideration of the distribution of the angle of beam spread of the fourth to sixth light sources 104, 105, and 106, and when the radius r1 of the virtual circle Vc is greater than the radius r1 of the virtual circle Vc, a rigidity of the module may be reduced by the increase of the depth of the recess portion C0 or the light blocking effect between adjacent light sources may be insignificant. A straight line Y1a passing through the center Px of the virtual circle Vc passing through the fourth convex portion P4 and the center of the fourth light source 104 and the straight line Y1b passing through a center Px of a virtual circle Vc passing through the fifth convex portion P5 and the center of the fifth light source 105 may be parallel to each other. In this case, the distance D6 between the two adjacent virtual circles Vc may be greater than the minimum width of the recess portion C0. Here, the minimum width of the recess portion C0 may be the minimum distance between two adjacent convex surfaces S11 or the minimum width of the concave surface S12. A distance r2 between the light sources 100 (104, 105, and 106) and the center Px of the virtual circle Vc may be smaller than a radius r1 of the virtual circle Vc. The distance r2 is a distance between each light source and the center Px of the circle at each convex portion P0, and the distances r2 are the same as each other to ensure uniformity of light. The radius r1 of the virtual circle Vc formed by the convex portion P0 may be 5 mm or more, for example, in a range of 5 mm to 15 mm, or in a range of 8 mm to 11 mm. An angle V4 between an imaginary straight line Vt5 connecting adjacent light sources 104, 105, and 106 and the straight lines Y1a and Y1b may be an obtuse angle. The angle V4 may be greater than the angles V1, V2, and V3 in FIG. 6.

Referring to FIGS. 8 and 5, in the third region A3 adjacent to the fourth surface S4, straight lines Y2a, Y2b and Y2c passing through the center of the virtual circle Vc forming the convex portion and the center of each light source 108 may be parallel to each other. Here, an angle V5 between the imaginary straight line Vt6 connecting the adjacent light sources 108 and the straight lines Y2a, Y2b, and Y2c may be an obtuse angle. The angle V5 may be greater than the angle V4 in FIG. 7. Here, the convex portions P0 adjacent to the fourth surface S4 will be described as seventh to ninth convex portions P7, P8, and P9, and the recess portions C0 will be described as the seventh and eighth recess portion C7 and C8. the straight line Y9a passing through the center Px of the virtual circle VcX constituting the ninth convex portion P9 and the center of the ninth light source 109 may be parallel to the straight lines Y2a, Y2b, and Y2c. The straight line Vx2 connecting the centers Px of the virtual circle VcX may be gradually spaced apart from the recess portion C0 or the concave surface S14. Here, the eighth recess portion C8 between the two adjacent convex portions P8 and P9 adjacent to the fourth surface S4 may form a virtual circle Vs2. The virtual circle Vs2 may be the same as or smaller than the diameter of the virtual circle VcX forming the convex portions P8 and P9, for example, the virtual circle Vs2 formed by the concave surface S14 in the recess portion C8 may be provided with a curvature having a difference of 10% or less from the diameters of the virtual circles VcX and Vc formed by the ninth convex portion P9. That is, the curvature of the ninth convex portion P9 and the curvature of the last eighth recess portion V8 may be the same or have a difference of 10% or less. In this case, the distance D21 between the ninth convex portion P9 and the ninth light source 109 may be smaller than the diameters of the virtual circles Vs2 and VcX. That is, when the ninth light source 109 is disposed within the circumference of the virtual circle VcX and the radius of curvature of the concave surface S14 of the eighth recess portion C8 is the maximum, the distance D21 may be smaller than or equal to a diameter of two adjacent virtual circles Vs2 and VcX. By providing a larger radius of curvature of the concave surfaces S14 in the region adjacent to the ninth convex portion P9, the light emitted from the light sources 108 and 109 arranged in the third region A3 may be emitted through the concave surface S14. In an embodiment of the invention, the curvature of the concave surface S14 or the curvature of the recesses C7 and C8 gradually increases from the third surface S3 to the fourth surface S4 direction, or a curvature of the fourth surface S4 adjacent to the concave surface S14 or the recess portion C8 may have the largest curvature among the concave or recess portions. In this case, the area of the convex portions may decrease toward the third region or may be greatest in the third region A3. In this case, as the convex portions are gradually moved in the second surface direction based on the second direction X, the curvature of the connecting section of the convex portions may gradually decrease. That is, the radius of curvature of each of the concave surfaces S14 or the recess portions C0 (C7 and C8) is gradually increased as it is adjacent to the fourth surface S4.

Figure 9:
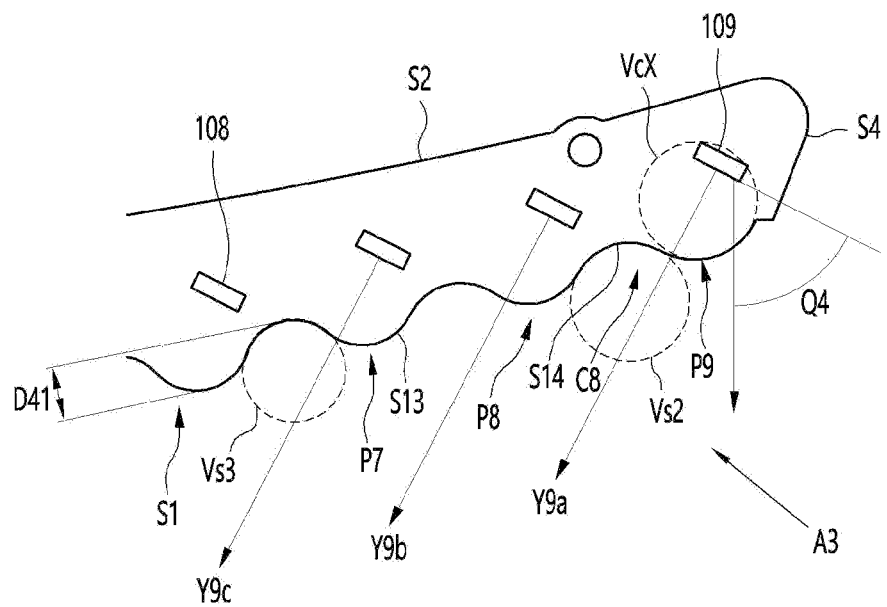
FIG. 9 is a view illustrating a recess portion in the third region A3 of the lighting device of FIG. 8.

Referring to FIGS. 8 and 9, when the last ninth convex portion P9 and the seventh and eighth convex portions P7 and P8 adjacent thereto are described, the straight lines Y9a, Y9b, and Y9c passing through the center Px of the virtual circle constituting the seventh to ninth convex portions P7, P8, and P9 and the center of each light source may be parallel to the straight lines Y2a, Y2b, and Y2c. In this case, the area in contact with the circumference of the virtual circle Vc constituting each of the convex portions P0 (P7, P8, and P9) may gradually decrease toward the ninth convex portion P9. For example, the contact area between the virtual circle VcX passing through the ninth convex portion P9 and the outline of the ninth convex portion P9 may be ⅓ or less than or less than ¼ of the length of the circumference of the virtual circle VcX. In FIG. 6, the contact area between the virtual circle Vc passing through the first convex portion P1 and the outline of the first convex portion P1 is ⅓ or more or ½ or more of the length of the circumference of the virtual circle Vc. In this case, the diameter of the virtual circle Vc is the same, and the area of the convex surface S13 may gradually decrease in the direction of the ninth convex portion P9, and the area of the concave surface S14 may gradually increase. The difference in curvature between the convex surface S13 and the concave surface S13 may be gradually reduced in the direction of the fourth surface, and by connecting them to each other, each light source 100 in the third region A3 disposed on the virtual curve Vc0 may irradiate light in the same direction as each light source 100 in the first region A1. Also, in the third region A3, the depths D41 (refer to FIG. 9) of the recess portions C7 and C8 may gradually decrease in the direction of the fourth surface S4. In the third region A3, the heights of the convex portions P7, P8, and P9 may gradually decrease in the direction of the fourth surface S4. As shown in FIG. 9, the size of the virtual circles Vs2 and Vs3 formed by the concave surface S14 may become smaller as the distance from the fourth surface S4 or the ninth convex portion P9 increases. That is, the diameter of the virtual circle Vs3 formed by the concave surface S14 adjacent to the seventh convex portion P7 may be smaller than the diameter of the virtual circle Vs2 formed by the concave surface S14 adjacent to the ninth convex portion P9. As shown in FIGS. 5 and 9, the size of the virtual circle formed by the concave surface gradually may gradually increase toward the fourth surface S4 direction, or the size of the virtual circle formed by the concave surface may gradually decrease toward the third surface S3 direction.

Figure 10:
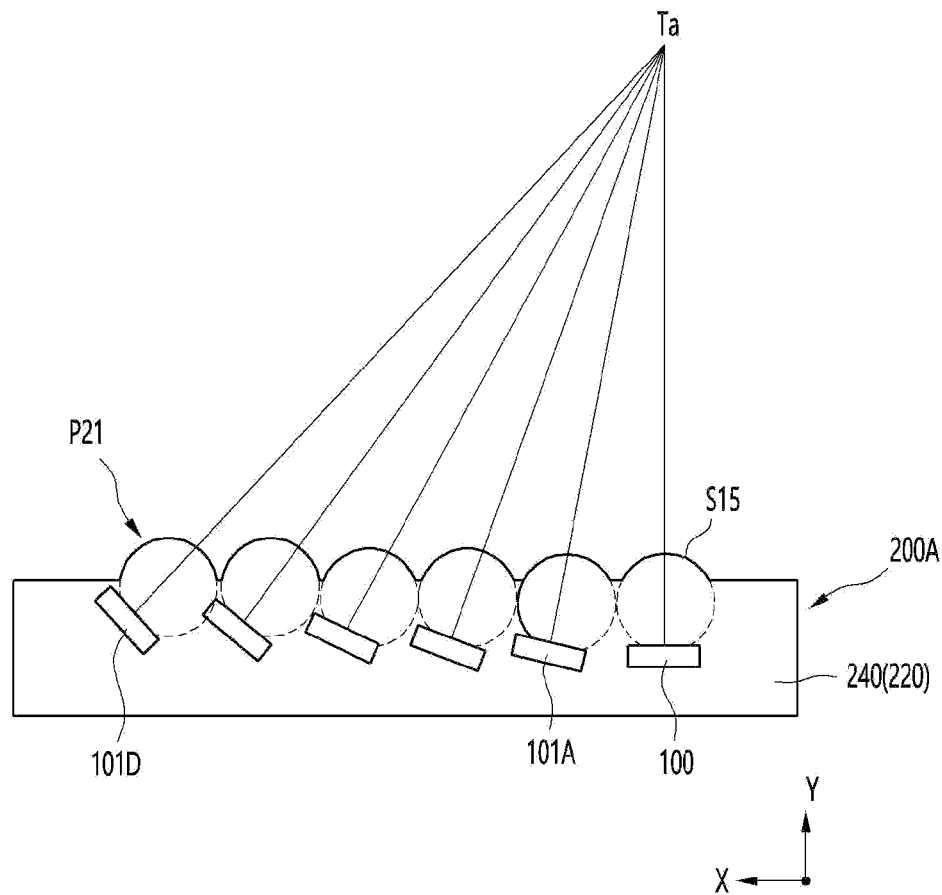
FIG. 10 is a view illustrating an example in which a light source and a convex portion of a resin layer are aligned in a target direction in a lighting device according to an embodiment of the invention.

FIG. 10 is another example of the invention, wherein the emission surface of the lighting device 200A does not have a curved structure. The centers of each light source 100, 101A, and 101D and the convex portion P21 are may be arranged toward the target point Ta so that each of the light sources 100, 101A, and 101D of the lighting device 200A maybe focused on the target point Ta. That is, each of the light sources 100, 101A and 101D may have a greater slope angle as the light sources 101A and 101D move away with respect to the light source 100 perpendicular to the target point Ta. A straight line passing through the center of the convex portion P21 and the convex surface S15 corresponding to each of the light sources 100, 101A, and 101D and the center of each of the light sources 100, 101A, and 101D may intersect at the target point Ta. The distance between the target point Ta and each of the convex portions P21 may vary depending on the type of lamp.

Figure 11A:
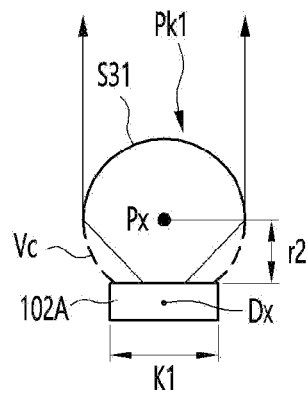
FIGS. 11A and 11B are views for explaining a light exit angle from a convex portion according to a position of a light source having a first size according to an embodiment of the invention.
Figure 11B:
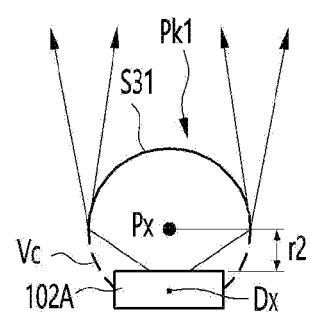

In (A) (B) of FIG. 11, the center Px of the virtual circle Vc forming the convex portion Pk1 is aligned with the center Dx of each light source 102A, and In FIG. 11(A), the center Dx of the light source 102A may be disposed on the line or circumference of the virtual circle Vc, and in FIG. 11(B), the center Dx of the light source may be disposed within the line or circumference of the virtual circle Vc. It is possible to adjust the position of each light source 102A and the size K1 of each light source 102A according to the exit angle emitted from each light source 102A and the radius of curvature of each convex portion Pk1.

Figure 12A:
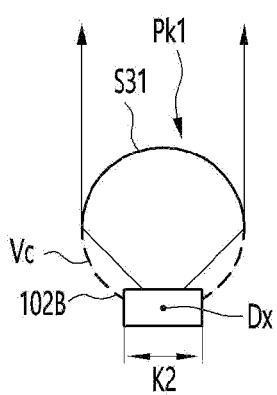
FIGS. 12A and 12B are views for explaining a light exit angle from a convex portion according to a position of a light source having a second size according to an embodiment of the invention.
Figure 12B:
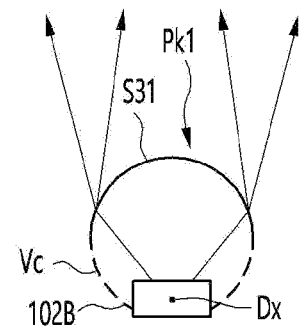

In (A) (B) of FIG. 12, the light source 102B may have a size K2 smaller than the size K1 of the light source 102A illustrated in FIG. 11. In FIG. 12, the size of the light source, that is, the length K2 of the long side may be less than 5 mm, for example, in the range of 2 mm to 4 mm. In FIG. 11, the size K1 of the long side of the light source 102A may be 5 mm or more, for example, in the range of 5 mm to 7 mm. This is because the exit angle from the convex surface S31 varies according to the size of each of the light sources 102A and 102B, so that the radius of curvature of the convex portion Pk1 may vary.

Figure 13A:
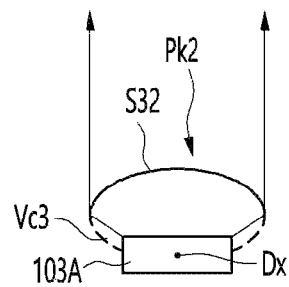
FIGS. 13A and 13B are views comparing exit angles according to positions of light sources in a convex portion having an elliptical shape elongated in the second direction according to an embodiment of the invention.
Figure 13B:
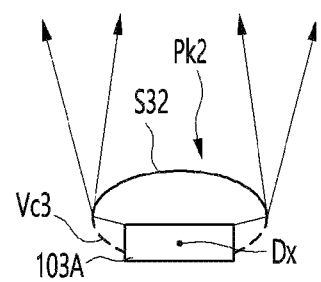

FIG. 13(A)-(B) shows a case in which the convex portion Pk2 is disposed in an elliptical shape having a long length in the second direction X, and the maximum width of the convex portion Pk2 may be greater than the height. Accordingly, the distance between the apex of the convex portion Pk2 or the convex surface S32 and the light source 103A may be further narrowed. In this case, in the elliptical shape, a length in a direction perpendicular to the emission direction of the light source 103A may be greater than a length in an emission direction of the light source 103A.

Figure 14A:
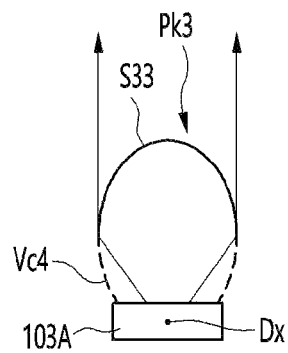
FIGS. 14A and 14B are views comparing exit angles according to positions of light sources in a convex portion having an elliptical shape elongated in the first direction according to an embodiment of the invention.
Figure 14B:
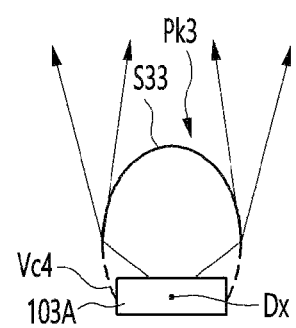

FIG. 14(A)-(B) shows a case in which the convex portion Pk3 is disposed in an elliptical shape having a long length in the first direction Y, and the maximum width of the convex portion Pk3 may be smaller than the height. Accordingly, the distance between the convex portion Pk3 or the convex surface S33 and the light source 103A may be increased. In this case, the elliptical shape may have a length in a direction perpendicular to the emission direction of the light source 103A may be smaller than a length in the emission direction of the light source 103A.

Figure 15A:
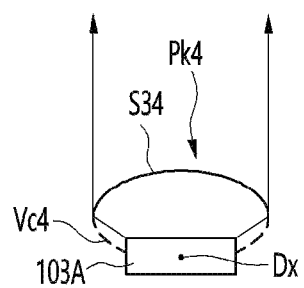
FIGS. 15A and 15B are examples of changing the position of a light source in a convex portion having an aspherical lens shape according to an embodiment of the invention.
Figure 15B:
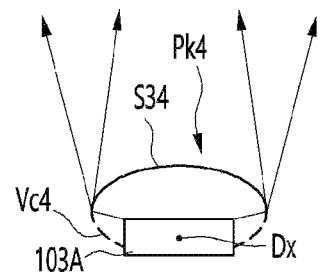

FIG. 15(A)-(B) shows that the curve of the convex portion Pk4 includes an aspherical shape, and the center Dx of the light source overlaps on a line of a circle having an aspherical surface, or may be disposed inside the line of the circle having an aspherical surface. The aspherical convex surface S34 may diffuse light to prevent hot spots from the center side and further increase light extraction efficiency at the edge side.

Figure 16:
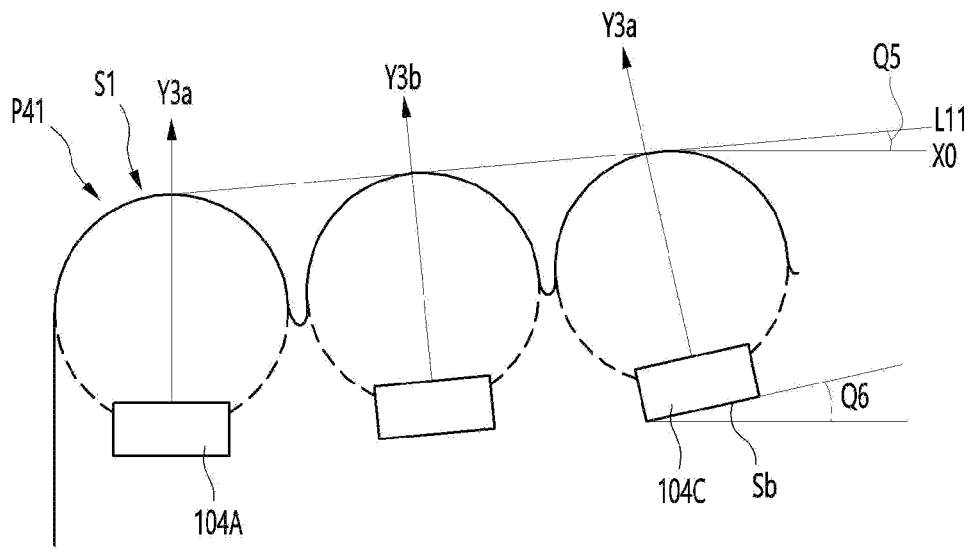
FIGS. 16 and 17 are views illustrating an example in which convex portions are gradually spaced apart from each other in the second direction according to an embodiment of the invention.

An example in which the direction of light is modified by the convex portions and the light sources will be described with reference to FIGS. 16 to 18. Referring to FIG. 16, the straight line L11 connecting the convex portions P41 of the resin layer may be disposed at a predetermined angle Q5 with respect to the horizontal straight line X0, and the angle Q5 may range from 1 degree. to 65 degrees. At this time, the reference light source 104A adjacent to the edge or center of the lighting device may not be tilted with respect to the horizontal straight line X0, and other light sources 104C may be tilted. The tilted angle Q6 may range from 1 degree to 65 degrees. This tilted angle Q6 may be selected within the above range according to the line of the lamp housing or bracket. The straight lines Y3a, Y3b, and Y3c passing through the centers of the convex portion P41 and the light sources 104A and 104C may be parallel to each other or may converge to the target region. Other convex portions may further protrude in the emission direction based on a tangent line to the convex portion P41 opposite to the reference light source 104A.

Figure 17:
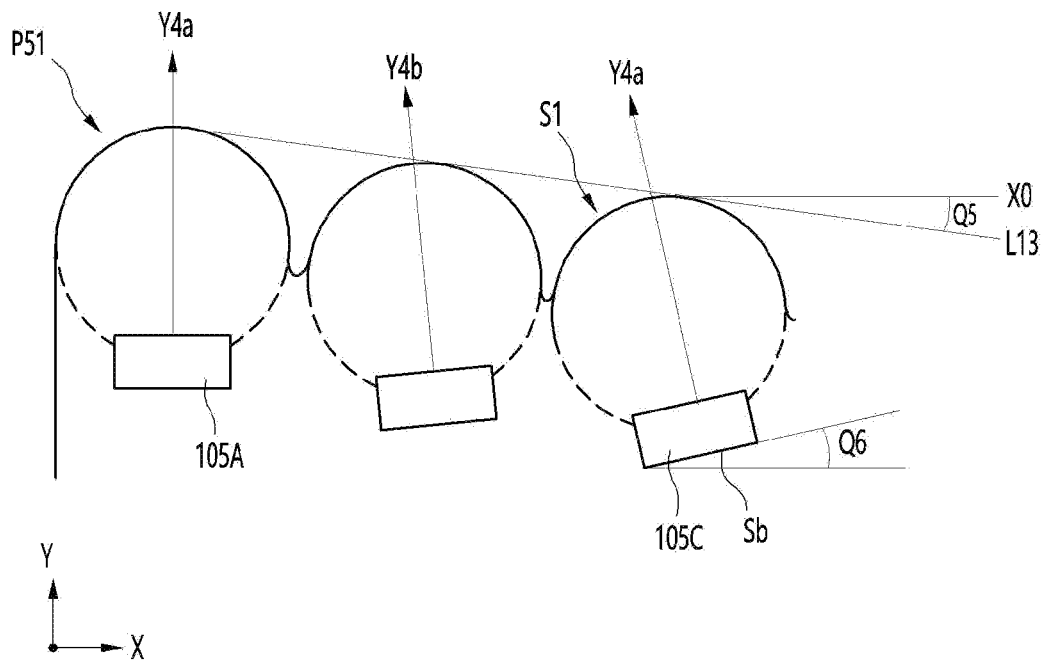

Referring to FIG. 17, the straight line L13 connecting the convex portions P51 of the resin layer may be disposed at a predetermined angle Q5 with respect to the horizontal straight line X0, and the angle Q5 may range from 1 degree. to 65 degrees. In this case, the reference light source 105A adjacent to the edge or center of the lighting device may not be tilted with respect to the horizontal straight line X0, and other light sources 105C may be tilted. The tilted angle Q6 may range from 1 degree to 65 degrees. This tilted angle Q6 may be selected within the above range according to the line of the lamp housing or bracket. The straight lines Y4a, Y4b, and Y4c passing through the centers of the convex portion P51 and the light sources 105A and 105C may be parallel to each other or may converge to the target region. Other convex portions may be disposed in a rearward direction based on a tangent to the convex portion P51 opposite to the reference light source 105A.

Figure 18:
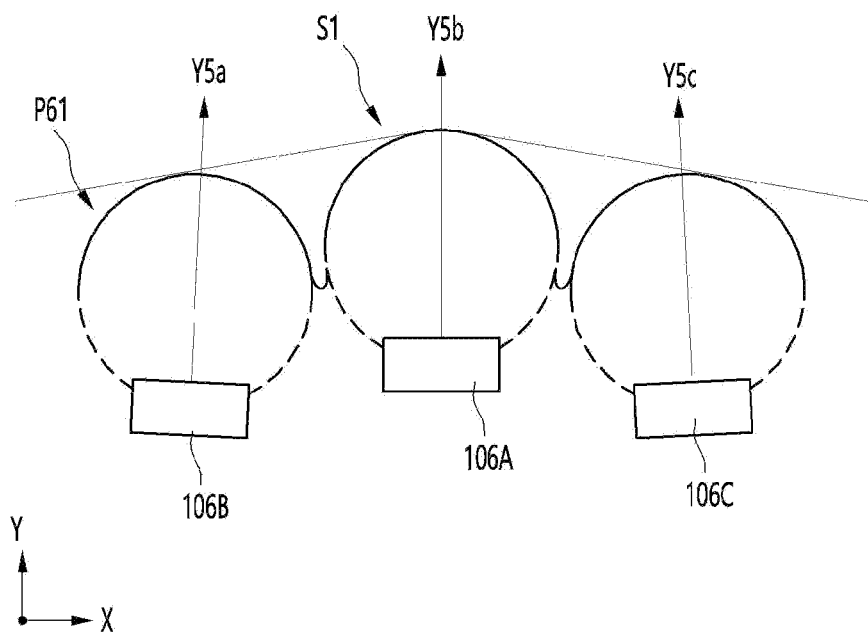
FIGS. 18 and 19 are views illustrating examples in which light sources are arranged in a triangular shape according to an embodiment of the invention.

FIG. 18 shows that the outer light sources 106B and 106C are positioned in the rearward direction around the center-side reference light source 106A of the lighting device, and the reference light source 106A and the outer light sources 106B and 106C may be arranged in a triangular structure. In addition, a shape connecting the apexes of each of the convex portions P61 may be provided as a triangular shape. The straight lines Y5a, Y5b, and Y5c passing through the centers of the convex portion P61 and the light sources 106A, 106B, and 106C may be parallel to each other or may converge to the target region.

Figure 19:
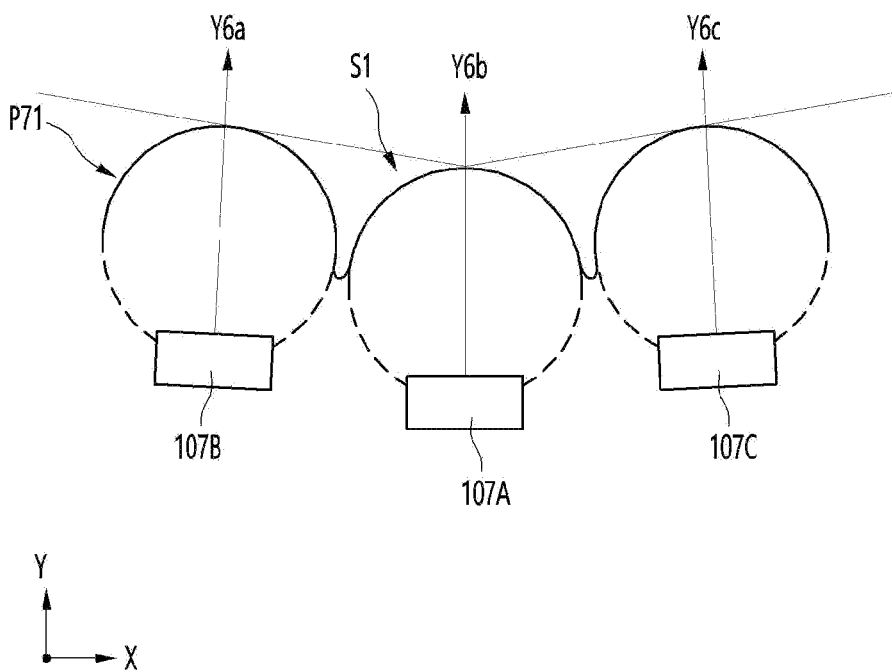
Figure 20:
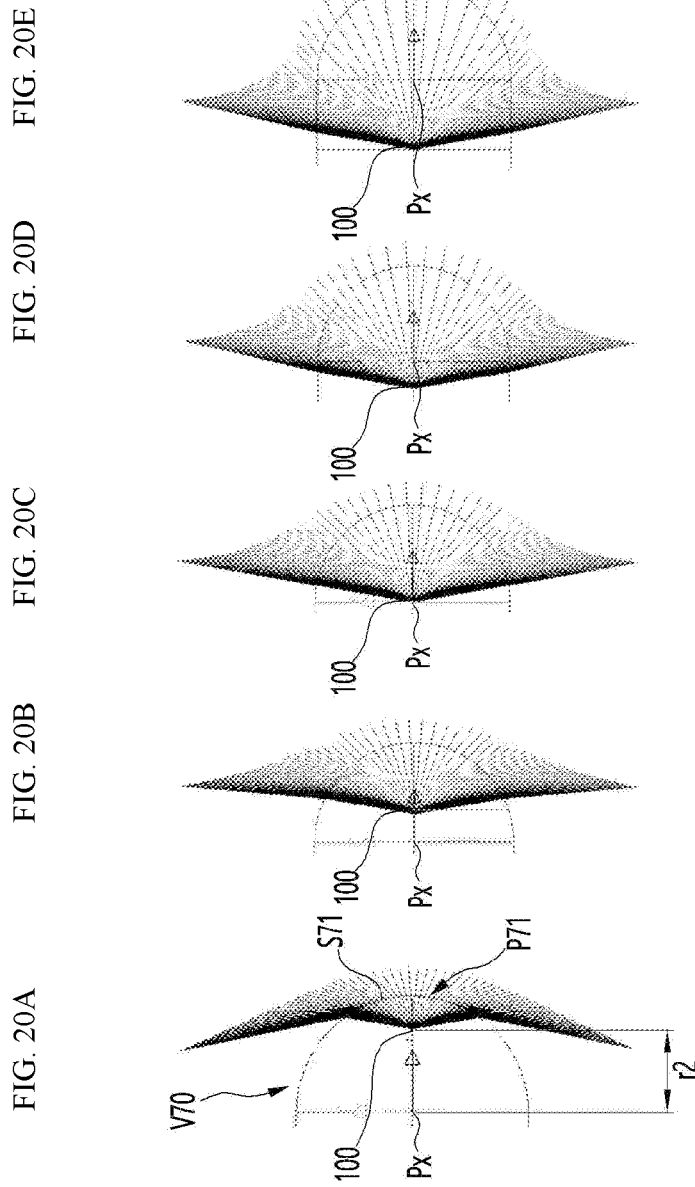
FIGS. 20A to 20E are views for explaining a path of light according to a difference in distance between a position of a light source and a center of a convex portion according to an embodiment of the invention.

FIG. 19 shows that the outer light sources 107B and 107C are positioned in the front direction with respect to the center-side reference light source 107A of the lighting device, and the reference light source 107A and the outer light sources 107B and 107C may be arranged in an inverted triangular structure. In addition, a shape connecting the apexes of each of the convex portions P71 may be provided as an inverted triangular shape. The straight lines Y6a, Y6b, and Y6c passing through the centers of the convex portion P71 and the light sources 107A, 107B, and 107C may be parallel to each other or may converge to the target region. At least one or two or more lighting devices of FIGS. 16 to 19 may be selectively applied to the lighting device of FIG. 1 or a region within the lighting device of FIG. 5. For example, in the lighting device of FIG. 5, the lighting device of FIGS. 16 to 19 may be selectively disposed in at least one of the first to third regions A1, A2, and A3.

FIG. 20(A)-(E) is diagrams comparing the distribution of emitted light according to a difference in distance between the center Px of the virtual circle Vc constituting the convex portion and the center Dx of the light source 100. Here, the refractive index of the resin layer may be in the range of 1.2 to 1.7, and the greater the refractive index of the resin layer, the higher the light collection. In addition, as the center Dx of the light source 100 and the center Px of the virtual circle Vc move away from each other, the concentrated light distribution may be higher. That is, looking at the distance between the center Dx of the light source 100 and the center Px of the virtual circle Vc, when the center of the virtual circle V70 or the convex portion P71 may be 0, FIG. 20(A) may have a distance r2 of 5 mm, FIG. 20(B) may be 2 mm, FIG. 20(C) may be at the same location, FIG. 20(D) may be −2 mm, and FIG. 20(E) may be −5 mm. Here, since the center Dx of the light source in FIG. 20(D)(E) is irradiated at a position further apart from the center Px of the virtual circle Vc, the light distribution may be further increased.

Figure 21:
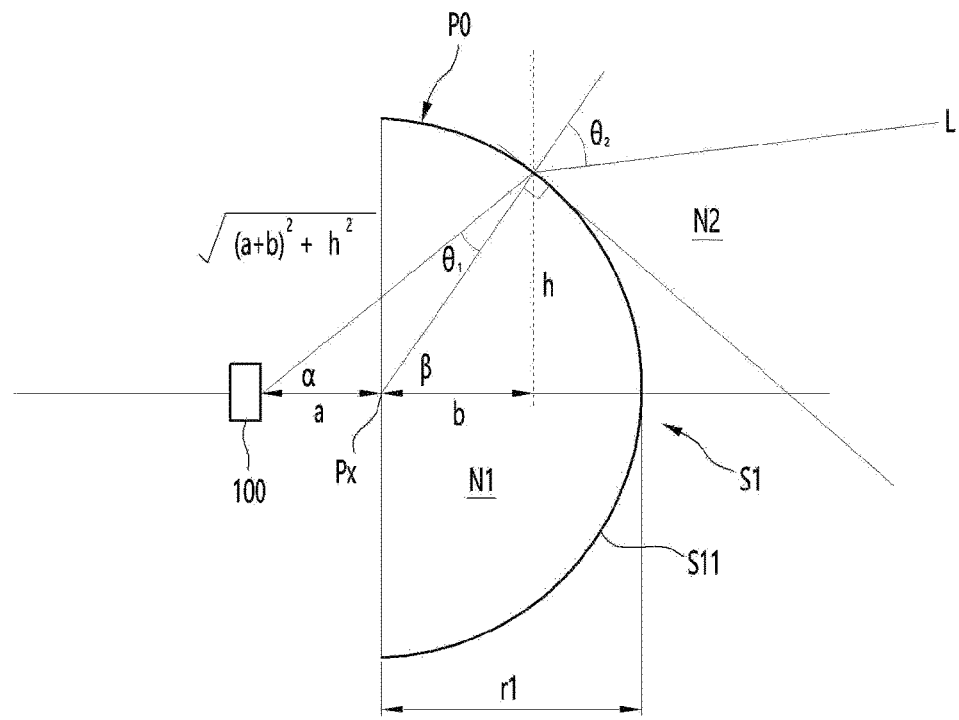
FIG. 21 is a view for explaining an exit angle of light according to a position of a convex portion of a resin layer and a light source according to an embodiment of the invention.

FIG. 21 is a view illustrating an exit angle according to a center position of a light source and a convex portion according to an embodiment of the invention. Referring to FIG. 21, The incidence angle and the exit angle to the convex surface S11 may be obtained using parameters such as the position of the light source and the center Px of the virtual circle Vc, the distance between the center Px of the virtual circle Vc and the light source, the refractive index of the resin layer and external refractive index by Snell's law on each convex portion or convex surface S11. Here, N1 is the refractive index of air (e.g., 1), N2 is the refractive index of the resin layer, and may be in the range of 1.2 to 1.7. According to Snell's law, θ1 is the incidence angle based on the normal to the tangent line passing through the virtual circle, and θ2 is the exit angle based on the normal. Here, it has an interaction formula of N1×sin θ1=N2×sin θ2, and may be obtained as N1=sin θ2/sin θ1. Here, the exit angle θ1 may be obtained by a trigonometric function, and θ2 may be obtained from the distance (a) between the θ1 and the center Px of the light source and the virtual circle Vc, and each parameter (h, α, β, b, r2) and then applied Snell's rule. Since the light distribution may be changed by the exit angle, the distance (a) between the position of the light source and the center of the convex portion may be adjusted according to the light collection distribution.

Figure 22:
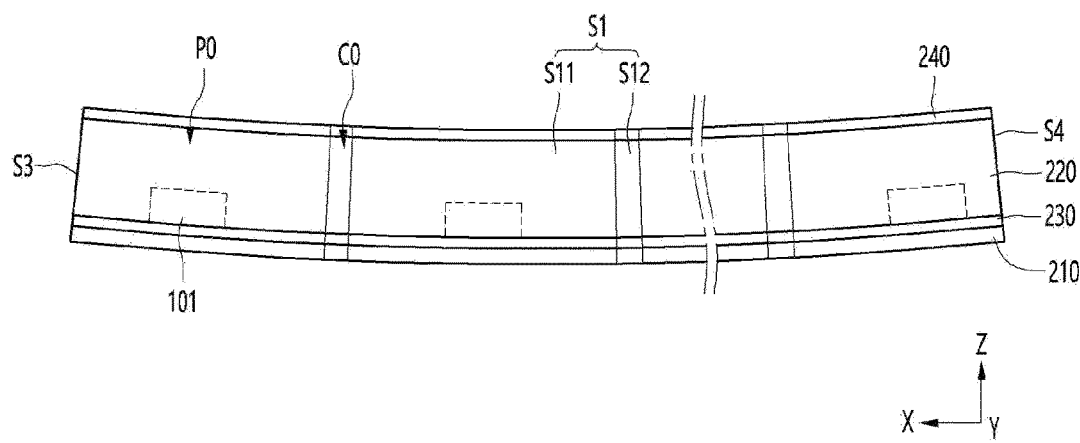
FIGS. 22 and 23 are examples of a flexible lighting device according to an embodiment of the invention.
Figure 23:
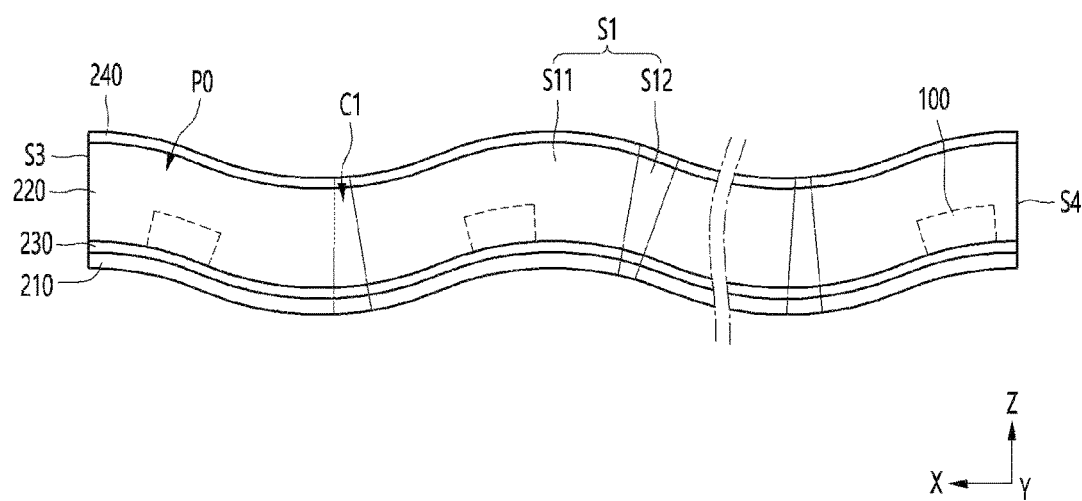

As shown in FIG. 22, the lighting device according to the embodiment may be curved convexly in the down direction or the substrate direction toward the center region with respect to the third and fourth surfaces S3 and S4, or vice versa bent convexly in the up direction or the second reflective layer direction. As shown in FIG. 23, the lighting device according to the embodiment includes a convex region convex in an up direction or a second reflective layer direction from the third surface S3 to the fourth surface S4, and at least one concave region recessed in a down direction in a substrate direction between the adjacent convex regions. The convex region and the concave region may be alternately arranged with each other.

The embodiments, modifications, or other examples disclosed above may be selectively mixed with each other or replaced with structures of other examples, and the embodiments disclosed above may be selectively applied to each example. In addition, a reflective layer or a reflective film made of a resin material may be attached to the second, third and fourth surfaces S2, S3, and S4 of the resin layer 220 except for the first surface. Such a reflective layer or reflective film can block light leakage in the non-emissive region. In an embodiment of the invention, when the thickness of the resin layer 220 is provided to be 3 mm or less in the lighting device, or to be thicker, for example, in a range of 3 mm to 6 mm, the light emitting area is increased due to the increase in the thickness of the resin layer 220, Light distribution may be improved. A lighting device according to an embodiment of the invention may be applied to a lamp as shown in FIG. 19. The lamp is an example of a vehicle lamp, and is applicable to a head lamp, a side lamp, a side mirror lamp, a fog lamp, a tail lamp, a brake lamp, a daytime running lamp, a vehicle interior lighting, a door scar, a rear combination lamp, or a backup lamp.

Figure 24:
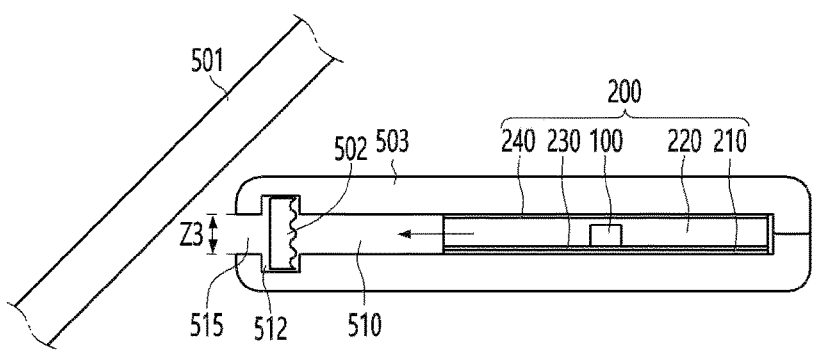
FIG. 24 is an example of a lamp to which a lighting device according to an embodiment of the invention is applied.

Referring to FIG. 24, the lighting device 200 having the first and second light sources 101 and 103 described above may be coupled to the lamp in a housing 503 having an inner lens 502. The thickness of the lighting device 200 is such that it may be inserted into the inner width of the housing 503. The width Z3 of the emission portion 515 of the inner lens 502 may be equal to or equal to or less than twice the thickness of the lighting device 200, thereby preventing a decrease in luminous intensity. The inner lens 502 may be spaced apart from the front surface of the lighting device 200 by a predetermined distance, for example, 10 mm or more. An outer lens 501 may be disposed on the emission side of the inner lens 502. The lamp having the lighting device 200 is an example, and may be applied to other lamps in a flexible structure, for example, a curved surface or a curved structure when viewed from the side.

Features, structures, effects, etc. described in the above embodiments are included in at least one embodiment of the invention, and are not necessarily limited to only one embodiment. Furthermore, features, structures, effects, etc. illustrated in each embodiment can be combined or modified for other embodiments by those of ordinary skill in the art to which the embodiments belong. Accordingly, the contents related to such combinations and modifications should be interpreted as being included in the scope of the invention.

The invention claimed is:

1. A lighting device comprising:
a substrate;
a first reflective layer;
a plurality of light sources disposed on the substrate; and
a resin layer disposed between the substrate and the first reflective layer,
wherein the resin layer surrounds the plurality of light sources,
wherein the resin layer has different lengths in a first direction and a second direction orthogonal to each other,
wherein the resin layer includes a first surface and a second surface facing each other in a second direction,
wherein the resin layer includes an exit surface facing the light sources in the second direction,
wherein the exit surface includes the first surface,
wherein the plurality of light sources is disposed between the first surface and the second surface of the resin layer,
wherein the first surface of the resin layer includes a plurality of first convex portions,
wherein the substrate includes a plurality of second convex portions,
wherein the first reflective layer includes a plurality of third convex portions, and
wherein the plurality of first convex portions is disposed between the plurality of second convex portions and the plurality of third convex portions.

2. The light device of claim 1, wherein each of the plurality of first convex portions faces each of the plurality of light sources.

3. The light device of claim 1, wherein each of the plurality of first convex portions has a virtual first radius of curvature.

4. The light device of claim 3, wherein the resin layer includes a plurality of first recess portions respectively disposed between the plurality of first convex portions.

5. The light device of claim 4, wherein the substrate includes a plurality of second recess portions respectively disposed between the plurality of second convex portions, and
wherein the first reflective layer includes a plurality of third recess portions respectively disposed between the plurality of third convex portions.

6. The light device of claim 4, wherein each of the plurality of first recess portions has a virtual second radius of curvature smaller than the first radius of curvature.

7. The light device of claim 6, wherein the second radius of curvature is less than or equal to 0.12 times the first radius of curvature, and
wherein a thickness of the resin layer is less than twice a thickness of the light source.

8. The light device of claim 3, wherein the first radius of curvature is in a range of 5 mm to 15 mm.

9. The lighting device of claim 1, wherein a maximum distance between the second surface and each of the convex portions in the second direction is greater than a thickness of the resin layer.

10. The lighting device of claim 1, comprising:
a second reflective layer disposed between the substrate and the resin layer,
wherein the second reflective layer includes a plurality of fourth convex portions, and
wherein the plurality of fourth convex portions is disposed between the plurality of first convex portions and the plurality of second convex portions.

11. A lighting device comprising:
a substrate;
a first reflective layer;
a plurality of light sources disposed on the substrate; and
a resin layer disposed between the substrate and the first reflective layer,
wherein the resin layer surrounds the plurality of light sources,
wherein a maximum length of the resin layer in a first direction is greater than a maximum length in a second direction orthogonal to the first direction,
wherein the resin layer includes a first surface and a second surface facing each other in the second direction,
wherein the resin layer includes an exit surface facing the light sources in the second direction,
wherein the exit surface includes the first surface,
wherein the plurality of light sources is disposed between the first surface and the second surface of the resin layer,
wherein each of the resin layer, the substrate and the first reflective layer includes a plurality of convex portions protruding toward the first surface, and
wherein each of the plurality of light sources faces each of the plurality of convex portions of resin layer.

12. The light device of claim 11, wherein a distance between a convex portion adjacent to one side of the resin layer and the second surface in the second direction is greater than a distance between a convex portion adjacent to the other side of the substrate and the second surface in the second direction.

13. The light device of claim 12, wherein the plurality of light sources is arranged from a region adjacent to the one side to a region adjacent to the other side of the resin layer.

14. The light device of claim 12, wherein an angle between a first straight line passing through vertices of the convex portions adjacent to one side of the resin layer and a second straight line passing through vertices of the convex portions adjacent to the other side of the resin layer is an obtuse angle.

15. The light device of claim 11, wherein each of the light sources includes an emission surface that emits light in one direction, and
wherein the emission surface of each of the light sources faces each of the convex portions.

16. The light device of claim 11, wherein each of the resin layer, the substrate and the first reflective layer includes a plurality of recess portions respectively disposed between the plurality of convex portions.

17. The light device of claim 16, wherein each of the plurality of convex portions has a virtual first radius of curvature.

18. The light device of claim 11, wherein a minimum distance between the recess portion and the light source is greater than a maximum distance between the light source and the second surface.

19. The light device of claim 11, wherein the first radius of curvature is in a range of 5 mm to 15 mm,
wherein each of the plurality of recess portions has a virtual second radius of curvature smaller than the first radius of curvature.

20. The lighting device of claim 11, wherein a maximum distance between the second surface and each of the first convex portions in the first direction is greater than a thickness of the resin layer, and
wherein the thickness of the resin layer is 2 mm or less.

* * * * *